United States Patent [19]
Komori et al.

[11] Patent Number: 5,852,327
[45] Date of Patent: Dec. 22, 1998

[54] SEMICONDUCTOR DEVICE

[75] Inventors: Shigeki Komori; Tomohiko Yamashita; Masahide Inuishi, all of Tokyo, Japan

[73] Assignee: Mitsubishi Denki Kabushiki Kaisha, Tokyo, Japan

[21] Appl. No.: 709,592

[22] Filed: Sep. 9, 1996

[30] Foreign Application Priority Data

Feb. 14, 1996 [JP] Japan ..................................... 8-026861

[51] Int. Cl.⁶ .................................................. H01L 23/48
[52] U.S. Cl. .......................... 257/748; 257/549; 257/742; 257/509
[58] Field of Search .................................... 257/509, 549, 257/550, 551, 742, 743, 748

[56] References Cited

U.S. PATENT DOCUMENTS

| | | |
|---|---|---|
| 4,383,266 | 5/1983 | Sakai et al. ............................. 257/551 |
| 4,652,895 | 3/1987 | Roskos ..................................... 257/551 |
| 4,816,881 | 3/1989 | Boos et al. .............................. 257/743 |
| 4,945,070 | 7/1990 | Hsu ........................................... 257/742 |
| 5,027,165 | 6/1991 | Doluca ..................................... 257/551 |
| 5,072,274 | 12/1991 | Kokado .................................... 257/509 |
| 5,077,590 | 12/1991 | Fujihira .................................... 257/551 |
| 5,155,560 | 10/1992 | Sheperd ................................... 257/742 |
| 5,343,067 | 8/1994 | Nakagawa et al. ..................... 257/509 |
| 5,475,245 | 12/1995 | Kudo et al. ............................... 257/551 |
| 5,594,266 | 1/1997 | Beigel et al. ............................ 257/551 |
| 5,623,159 | 4/1997 | Monk et al. ............................. 257/509 |

Primary Examiner—David Ostrowski
Attorney, Agent, or Firm—McDermott, Will & Emery

[57] ABSTRACT

In a semiconductor substrate of a semiconductor device, a plural impurity layers of the same conductivity type as the substrate are formed. An impurity region of an opposite conductivity type penetrates at least one of the impurity layers to a certain depth from the main surface of the semiconductor substrate. The bottom surface of the impurity region terminates between the impurity layers where the impurity concentration is lower. A contact conductor is led out from the impurity region.

10 Claims, 28 Drawing Sheets

SEMICONDUCTOR DEVICE

TECHNICAL FIELD

The present invention relates to a semiconductor device, and more particularly to a semiconductor device having an improved contact structure between a semiconductor substrate and an upper conductive layer.

BACKGROUND ART

High integration of a semiconductor device and miniaturization of its elements are continually advancing, and the size of the contact is also being miniaturized. At the same time, there is an increase in the number of contacts formed in one device. Accordingly, the characteristics of each element influences the characteristics of the semiconductor device itself. For example, the diameter of a contact becomes miniaturized and the resistance of the contact increases. This disturbs the transmission of a signal in the semiconductor device and is one of the factors which causes signal delays, unstable transistor action, and so forth.

Further, even when a leakage current from a contact to the semiconductor substrate is small, the total leakage current becomes large in the semiconductor device in which tens of hundreds or tens of thousands of elements have been integrated. As semiconductor devices become increasingly integrated in the future, there is a possibility that this leakage current will occupy a large portion of the whole electric power consumed by the circuit. In accordance with the increase in the impurity concentration of the semiconductor substrate due to the scaling rule, there arise problems that the breakdown voltage at the contact is lowered and the operation voltage is inevitably limited.

FIG. 56 illustrates a cross-sectional view of a contact structure according to the conventional art. This figure shows a semiconductor substrate 101 containing impurities of a first conductivity type, for example, P-type impurities, an interlayer insulation film 102 deposited on the semiconductor substrate 101, a contact hole 103 opened in the interlayer insulation film 102, a contact conductor 104 formed by burying a conductive material in the contact hole 103, a connecting lead layer 105 extending from the contact conductor 104, and an impurity region 106 which is formed extending from the surface of the semiconductor substrate 101 under the contact conductor 104 to a predetermined depth and contains impurities of the second conductivity type, for example, N-type impurities.

In order to form the contact structure as shown in FIG. 56, first the contact hole 103 is opened, an optionally ion-implantation is performed to prevent a leakage current. Next, a conductive material such as polysilicon, tungsten, titanium or aluminum is buried into the contact hole, and thus the contact conductor 104 is formed.

FIG. 57 shows an example of an impurity profile of the conventional contact structure shown in FIG. 56, taken in the depth direction from the surface of the semiconductor substrate 101 under the contact conductor 104. The impurity concentration of the second conductivity type in the region impurity 106 shows a gradual decrease in accordance with an increase in the depth from the surface of the semiconductor substrate 101. On the other hand, the impurity concentration of the first conductivity type, which is the conductivity type of the semiconductor substrate 101, ranges from 1E16 (i.e. 1×1016) cm−3 to 1E17 (i.e. 1×1017) cm−3 up to a depth of 2.5 µm. An impurity concentration curve of the first conductivity type crosses an impurity concentration curve of the second conductivity type at the depth of 0.5 µm to 0.6 µm from the surface of the semiconductor substrate 101, and the impurity concentration at this point is about 1E17 (i.e. 1×1017) cm−3.

As shown in FIG. 58, when a transistor is manufactured, impurities of the first conductivity type are implanted and an impurity layer 107 is formed for the control of a threshold voltage. When the diameter of the contact is miniaturized in accordance with the scaling law, the contact area with an active region becomes small, leading to an increase in the contact resistance.

Even when the contact conductor 104 is in contact with the semiconductor substrate 101 or the impurity layer 107, the contact may be formed at a non-predetermined position owing to an alignment failure or the like in a photoengraving step. In such a case, the contact may be formed in contact with the silicon surface under the isolation oxide film, which causes an increase in the leakage current.

Further, there has been a problem that the junction breakdown voltage of the contact is being decreased due to an increase of the concentration of the substrate.

DISCLOSURE OF THE INVENTION

An object of the present invention is therefore to overcome the problems in the conventional semiconductor device such as a decrease in the junction breakdown voltage, an increase in the leakage current and an increase in the contact resistance. A further object of the invention is to simplify the manufacturing process so as to manufacture devices at low cost, and to maintain an isolation breakdown voltage required fore the isolation of device elements.

According to one aspect of the present invention, a semiconductor device comprises a semiconductor substrate of a first conductivity type. At least one impurity layer of the first conductivity type is formed in the semiconductor substrate. An impurity region of a second conductivity type penetrates at least one of the impurity layer or layers and extends to a predetermined depth from a main surface of the semiconductor substrate. A contact conductor is formed on the main surface of the semiconductor substrate in contact with the impurity region.

In another aspect of the invention, in the semiconductor device, at least one of the impurity layers is positioned deeper than the impurity region and not reached by the impurity region.

In another aspect of the invention, in the semiconductor device, a plurality of the impurity layers are penetrated by the impurity region.

In another aspect of the invention, in the semiconductor device, at least one of the impurity layers has therein a first area in contact with the impurity region and a second area extending from the first area. The first area has a lower impurity concentration than that of the second area.

In another aspect of the invention, in the semiconductor device, the impurity region has a bottom surface terminating between a plurality of the impurity layers or across the one impurity layer where the impurity concentration is lower.

In another aspect of the invention, in the semiconductor device, the impurity region has a larger size in a horizontal direction than the contact conductor.

In another aspect of the invention, the semiconductor device further comprises an impurity layer of the second conductivity type formed in contact with the impurity region on the main surface of the semiconductor substrate.

In another aspect of the invention, in the semiconductor device, the contact conductor is formed in contact with an element isolation region formed on the main surface of the semiconductor substrate.

In another aspect of the invention, in the semiconductor device, the contact conductor has a bottom surface inclined into the semiconductor substrate from the main surface of the semiconductor substrate.

Other features and advantages of the present invention will become more apparent from the following description taken together with the a accompanying drawings.

BEST MODE FOR CARRYING OUT THE INVENTION

This invention will be described in further detail by way of example with reference to the accompanying drawings.

The First Embodiment

Figure 1:
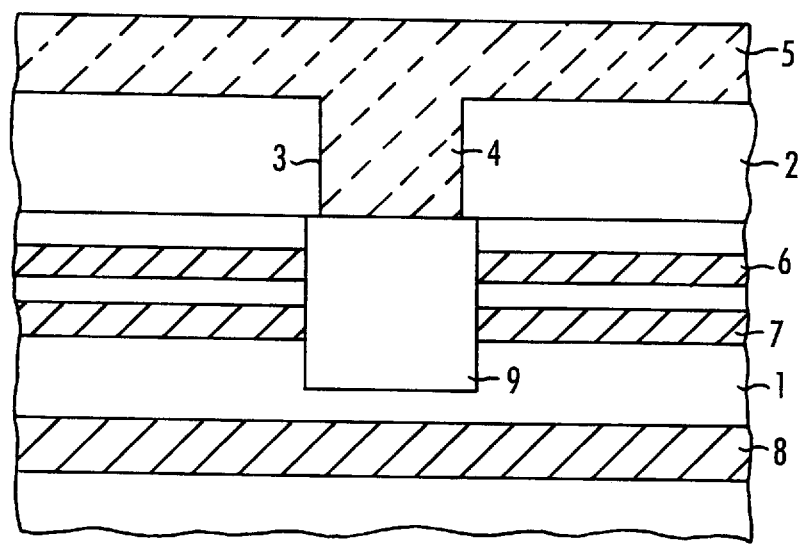
FIG. 1 illustrates a cross-sectional view of the contact structure of a semiconductor device according to the first embodiment of the present invention.

FIG. 1 illustrates a cross-sectional view of a contact structure of a semiconductor device according to the first embodiment of the present invention. As shown in FIG. 1, the device comprises a semiconductor substrate 1 formed of a silicon single crystal containing impurities of a first conductivity type, for example, P-type impurities. An interlayer insulation film 2 is deposited on the semiconductor substrate 1 and is formed of an insulating material such as silicon oxide film. A contact hole 3 extends from the upper surface of the interlayer insulation film 2 to the surface of the semiconductor substrate 1, and is in contact with the surface of the semiconductor substrate 1. The contact hole 3 has a predetermined aperture diameter, for example, 1.0 μm in a horizontal direction. A contact conductor 4 formed of a conductive material is buried in the contact hole 3. A connecting lead layer 5 formed of a conductive material is disposed on the interlayer insulation film 2 in contact with the contact conductor 4. Impurity layers 6 and 7 are formed at different depths in the semiconductor substrate 1 respectively, and contain impurities of the first conductivity type which are the same as the semiconductor substrate 1, for example, P-type impurities. The impurity layer 6 is formed nearer to the surface of the semiconductor substrate 1 than the impurity layer 7.

Further, an impurity layer 8 is formed at a position deeper than impurity layers 6 and 7, and contains impurities of the first conductivity type, for example, P-type impurities.

The impurity layer 6, which is nearest to the surface of the semiconductor substrate 1 among the impurity layers 6, 7 and 8, works to control the threshold voltage when a transistor is formed in the vicinity of the contact conductor 4. An impurity region 9, of the second conductivity type, is formed to extend from the surface of the semiconductor substrate 1 under the contact conductor 4, and reaches and penetrates the positions of impurity layers 6 and 7 terminating before reaching the impurity layer 8. As shown in the cross-sectional view of FIG. 1, the size of the contact 3 in a horizontal direction is 1.0 $\mu$m. On the other hand, the size of the impurity region 9 in the horizontal direction is about 1.2 $\mu$m, and is 1.2 times as wide as that of the contact 3 in a horizontal direction.

In FIG. 1, the impurity layers 6, 7 and 8 and the impurity region 9 are shown as clearly-divided regions respectively. In practice, each region contains an impurity concentration profile. The concentration is low at the upper and lower end of each of the impurity layers 6, 7 and 8, while the concentration at the middle points inbetween is high.

Figure 2:
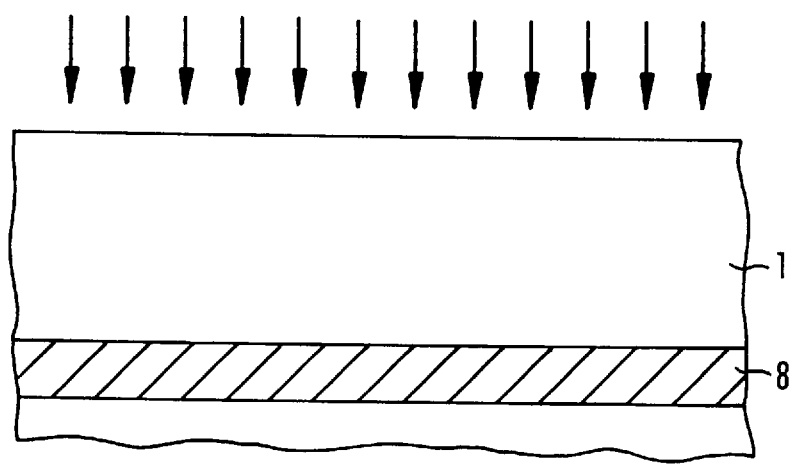
FIGS. 2–8 illustrate a manufacturing process of a semiconductor device having the contact structure according to the first embodiment.
Figure 3:
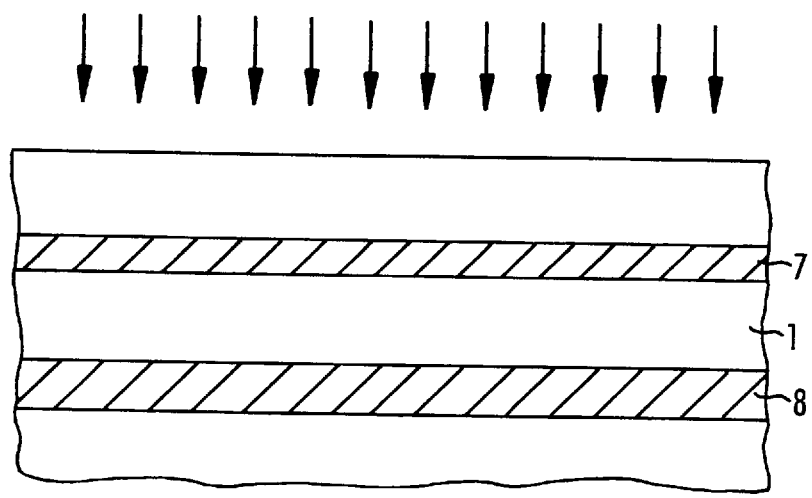

With reference to FIG. 2 to 8, a description of a manufacturing process of a semiconductor device having the contact structure is shown in FIG. 1 of the first embodiment. First, as shown in FIG. 2, boron ions are implanted as an impurity into a P-type semiconductor substrate 1 to form an impurity layer 8 of the first conductivity type at a predetermined depth from the surface of the semiconductor substrate 1.

Figure 4:
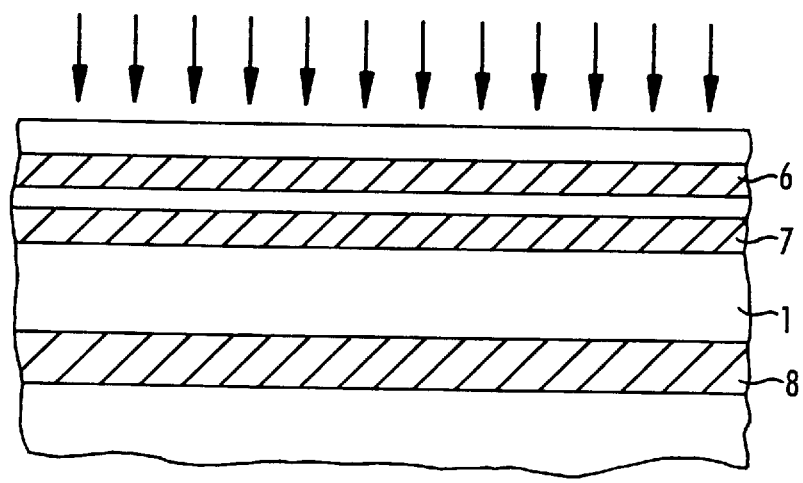

As shown in FIG. 3, boron ions are again implanted as an impurity in the same way as the formation of the impurity layer 8. By controlling the implantation energy and amount, an impurity layer 78 of the first conductivity type is formed at a position nearer to the surface of the semiconductor substrate 1 than the position of the impurity layer 8. Further, as is illustrated in FIG. 4, an impurity layer 6 of the first conductivity type is formed in the same way at a position nearer to the surface of the semiconductor substrate 1 than the impurity layer 7.

Figure 5:
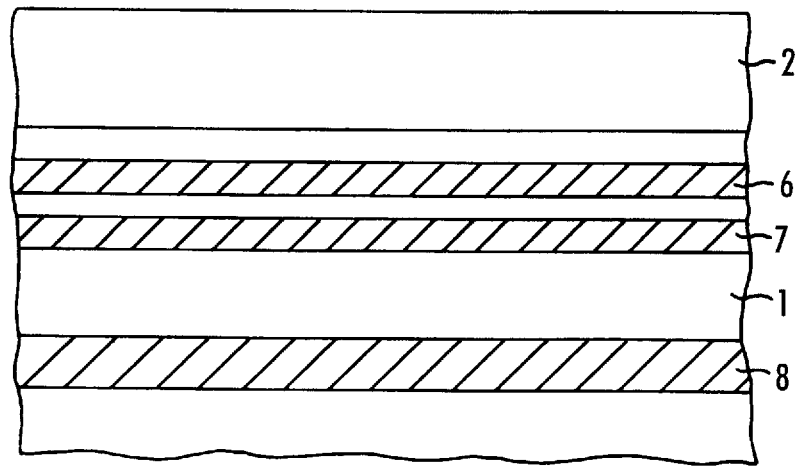
Figure 6:
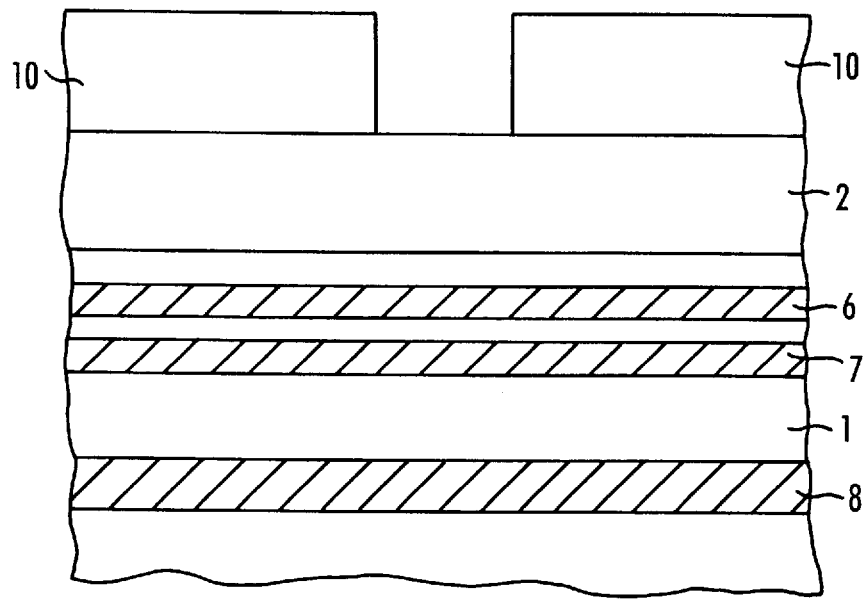
Figure 7:
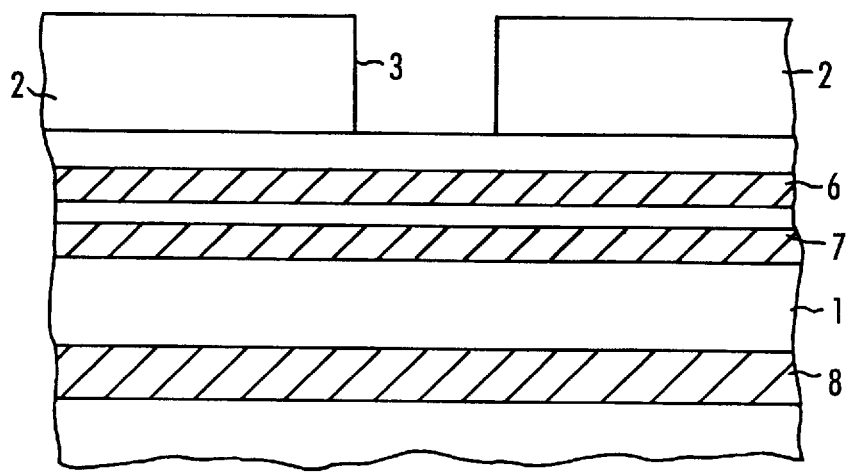

As shown in FIG. 5, an insulation material such as a silicon oxide film is deposited all over the surface of the semiconductor substrate 1 to a predetermined thickness by employing a technique such as CVD or sputtering, whereby an interlayer insulation film 2 is formed. Then, as shown in FIG. 6, a resist pattern 10 is formed on the interlayer insulation film 2, and a portion for a contact is removed by photoengraving. Then, as shown in FIG. 7, a contact hole 3 is formed extending from the surface of the interlayer insulation film 2 to the surface of the semiconductor substrate 1 by anisotropic etching of the interlayer insulation film 2 with the resist pattern 10 as an etching mask. The resist pattern 10 is thereafter removed.

Figure 8:
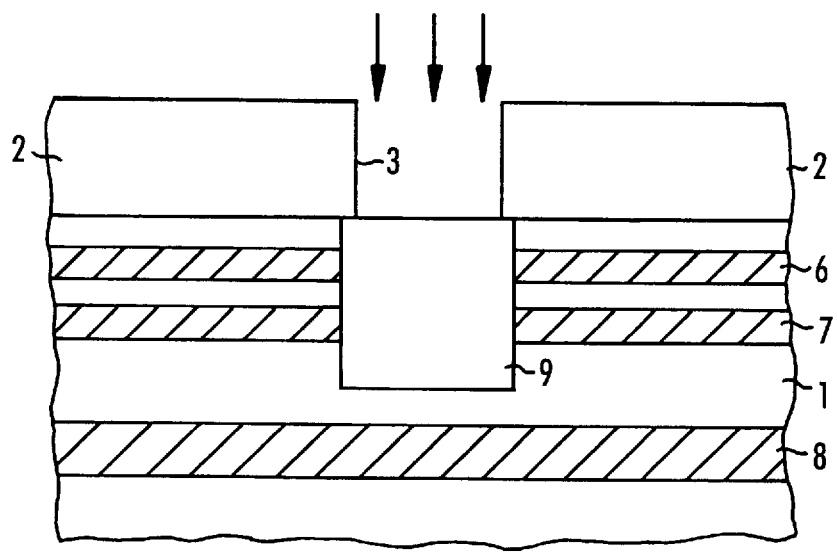

As illustrated in FIG. 8, by the implantation of impurities such as phosphorus or arsenic, an impurity region 9 of the second conductivity type, for example N type, is formed extending from the position of the impurity layers 7 and 8 to the surface of the semiconductor substrate 1. Then, a conductive material, for example, tungsten, titanium nitride, polysilicon or the like is buried in the contact hole 3 to form a contact conductor 4. At the same time a connecting lead layer 5 composed of a conductive material is formed on the surface of the interlayer insulation film 2. Thus, a contact structure as illustrated in FIG. 1 can be obtained. In FIG. 1, the connecting lead layer 5 is shown to be disposed along the cross-section shown in FIG. 1, however, the connecting lead layer 5 may be disposed in any direction on the surface of the interlayer insulation film 2.

Figure 9:
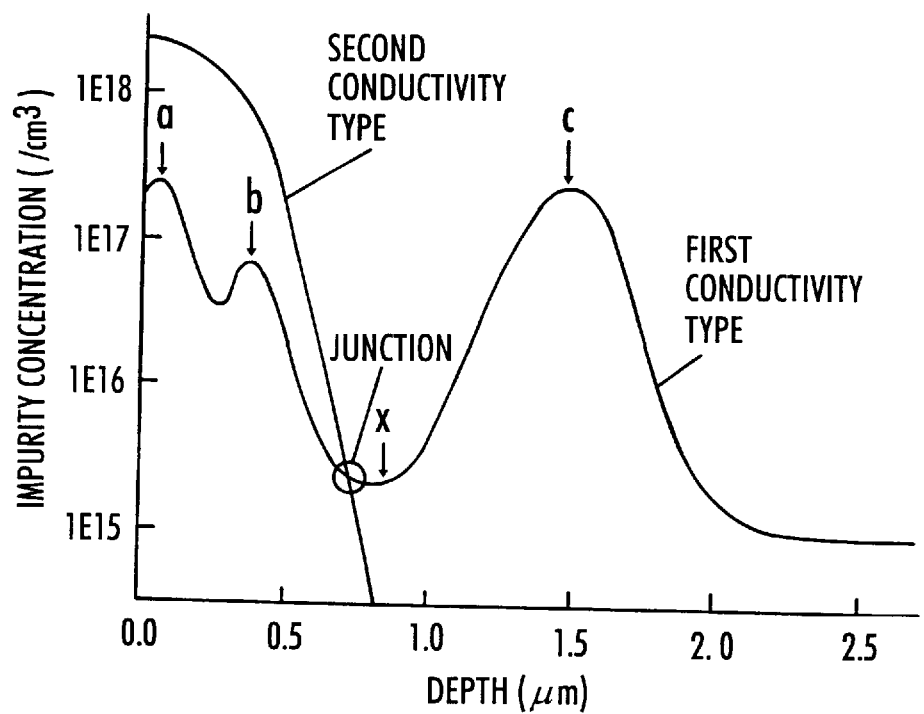
FIG. 9 illustrates profiles of the impurity concentrations in the contact structure according to the first embodiment.

FIG. 9 illustrated profiles of the impurity concentrations in the semiconductor substrate 1 below the contact conductor 4 of the contact structure shown in FIG. 1, in the depth direction from the surface of the semiconductor substrate 1.

As shown in FIG. 9, in the impurity concentration distribution of the first conductivity type, the maximum point 'a' of the impurity layer 6, the maximum point 'b' of the impurity layer 7 and the maximum point 'c' of the impurity layer 8 are formed respectively with an increase in the depth of the semiconductor substrate 1. On the other hand, the impurity concentration of the second conductivity type decreases with an increase in the depth of the semiconductor substrate 1. The two curves showing impurity concentrations of the first and second conductivity types respectively cross each other at the position 'x' where the impurity concentration of the first conductivity type is minimum between the maximum point 'b' and the maximum point 'c'.

Accordingly, at a position where the bottom surface of the impurity region 9 is joined to the semiconductor substrate 1, both of the impurity concentrations of the impurity region 9 and the semiconductor substrate 1 are low. Therefore, a depletion layer tends to expand, and the extension of the depletion layer becomes large as opposed to the case where the impurity concentrations are high.

The breakdown of the junction does not occur until the high voltage is applied to the contact, so that the breakdown voltage of the contact is raised. Further, the junction capacitance of the contact is also reduced. Thus, the characteristics and performance of the semiconductor device is improved by use of this contact structure.

The Second Embodiment

Figure 10:
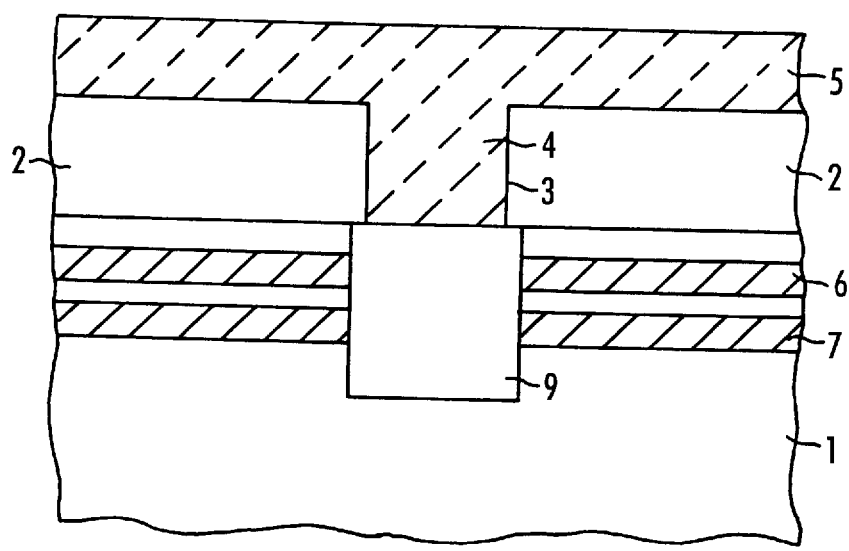
FIG. 10 illustrates a cross-sectional view of the contact structure of a semiconductor device according to the second embodiment of the present invention.

FIG. 10 illustrates a contact structure of a semiconductor device according to the second embodiment of the present invention, in which the impurity layer 8 included in the contact structure of FIG. 1 in the first embodiment has not been formed. In this second embodiment, the bottom surface of the impurity region 9 faces the semiconductor substrate 1 having a low impurity concentration, so that the contact structure with improved breakdown voltage of the contact can be obtained.

The Third Embodiment

Figure 11:
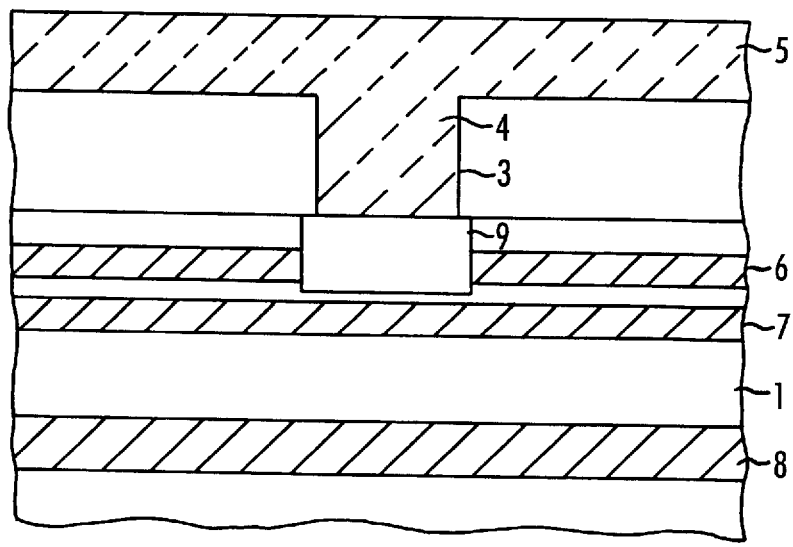
FIG. 11 illustrates a cross-sectional view of the contact structure of a semiconductor device according to a third embodiment of the present invention.

FIG. 11 illustrates a contact structure of a semiconductor device according to a third embodiment of the present invention. This embodiment is similar to the contact structure of the first embodiment shown in FIG. 1 except for the structure of the impurity region 9 formed in the semiconductor substrate 1 below the contact conductor 4. In the first embodiment, the impurity region 9 is penetrating the impurity layers 6 and 7. In this second embodiment, the impurity region 9 is disposed to be in contact only with the impurity layer 6 nearest to the surface of the semiconductor substrate 1 among the impurity layers 6, 7 and 8 formed at different depths respectively in the semiconductor substrate 1.

In the contact structure with an impurity region 9 disposed as described above, an impurity concentration profile of the impurities contained in the impurity layers 6, 7, that is, the impurities of the first conductivity type, are similar to that shown in FIG. 9. An impurity concentration profile of the impurities contained in the impurity region 9, that is, the impurities of the second conductivity type, falls between the impurity layers 6 and 7. The profile of the impurities of the first conductivity type and the profile of the impurities of the second conductivity type cross each other in a range between the maximum point and the minimum point, which exists below the maximum point and is nearest thereto, between peak 'a' and peak 'b' of the impurities of the first conductivity type. Accordingly, the bottom surface of the impurity region 9 is joined at a position of low impurity concentration in the semiconductor substrate 1. Therefore, when a voltage is applied to the contact conductor 4, the extension of the depletion layer from this position becomes large, resulting in the improvement in the breakdown voltage of the contact.

The Fourth Embodiment

Figure 12:
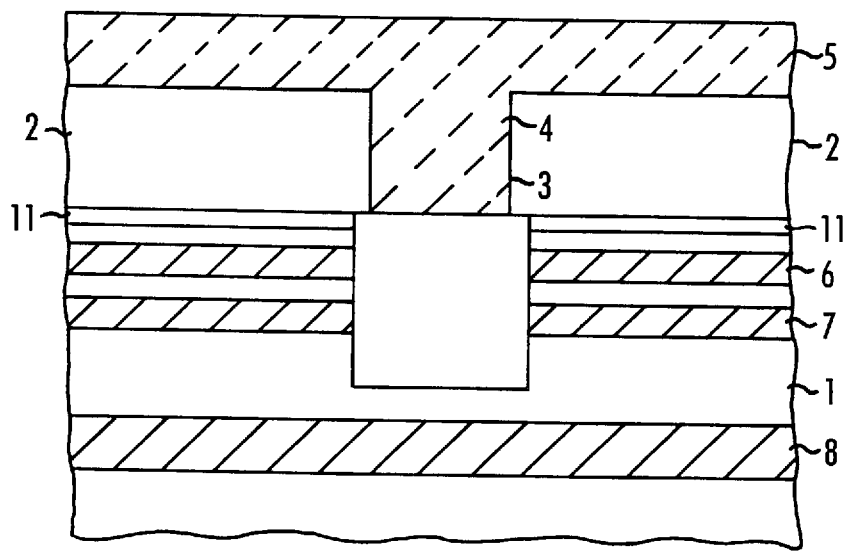
FIG. 12 shows a cross-sectional view of the contact structure of a semiconductor device according to a fourth embodiment of the present invention.

FIG. 12 shows a cross-sectional view of the contact structure of a semiconductor device according to a fourth embodiment of the present invention, which is similar to that of the first embodiment shown in FIG. 1 except for the addition of another impurity layer. An impurity layer 11, in which impurities of the second conductivity type have been diffused, is additionally formed on the surface of the substrate 1.

Figure 13:
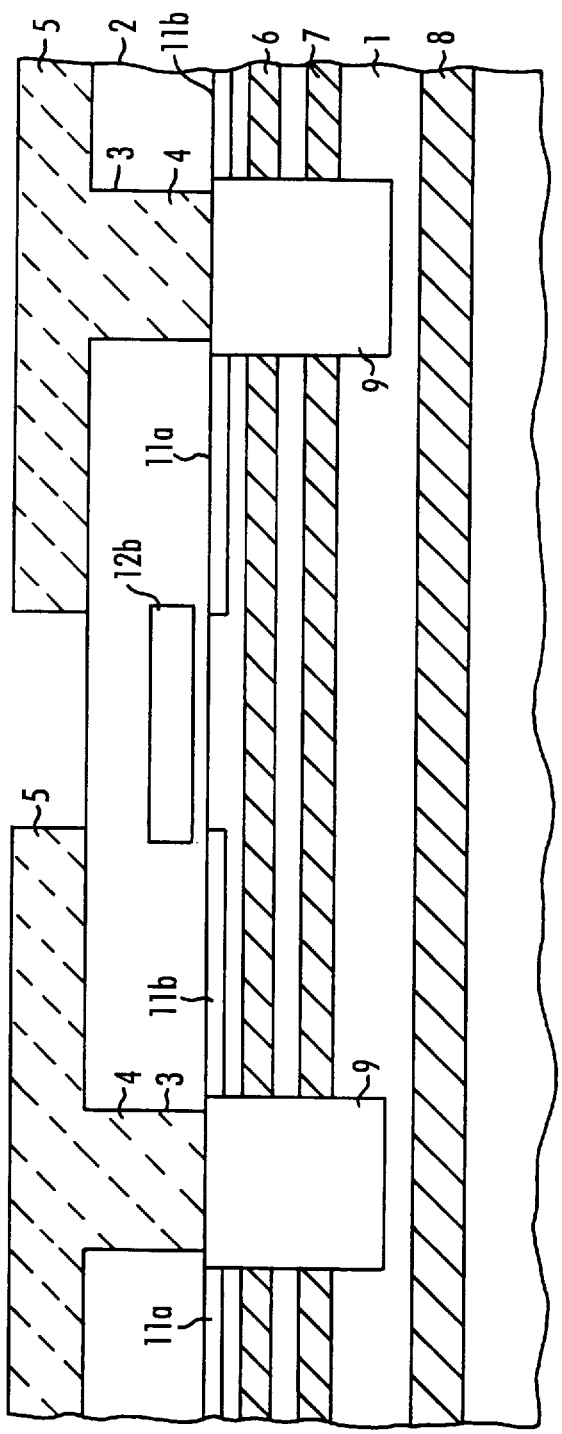
FIG. 13 illustrates a cross-sectional view of the contact structure applied to a source-drain electrode of an MIS transistor.

FIG. 13 illustrates a cross-sectional view of the contact structure of FIG. 12 which is applied to a source-drain electrode of an MIS transistor. FIG. 13 shows a gate electrode 12b of a switching transistor, a source region 11a and a drain region 11b. Other reference numerals which are the same as those already used for the description stand for the same or corresponding portions. The source region 11a and the drain region 11b are formed in such a way that their impurity concentration ranges from 1E18 (i.e. 1×1018) cm−3 to 1 1E21 (i.e. 1×1021) cm−3 and are disposed at a position from the surface of the semiconductor substrate 1 to the depth of 0.2 μm thereof.

A contact conductor 4 electrically connects the source region 11a and the drain region 11b with a connecting lead layer 5 respectively. Below the contact conductor 4, impurities are implanted more than once whereby impurity layers are formed. Similar to the contact structure obtained in the first embodiment, the contact structure obtained also has an impurity concentration profile containing plural maximum points and minimum points, which makes it possible to improve the junction breakdown voltage of the contact and also to decrease the junction capacitance. The contact structure shown in FIG. 13 is therefore effective for the manufacturing of a semiconductor device having an excellent performance.

Figure 14:
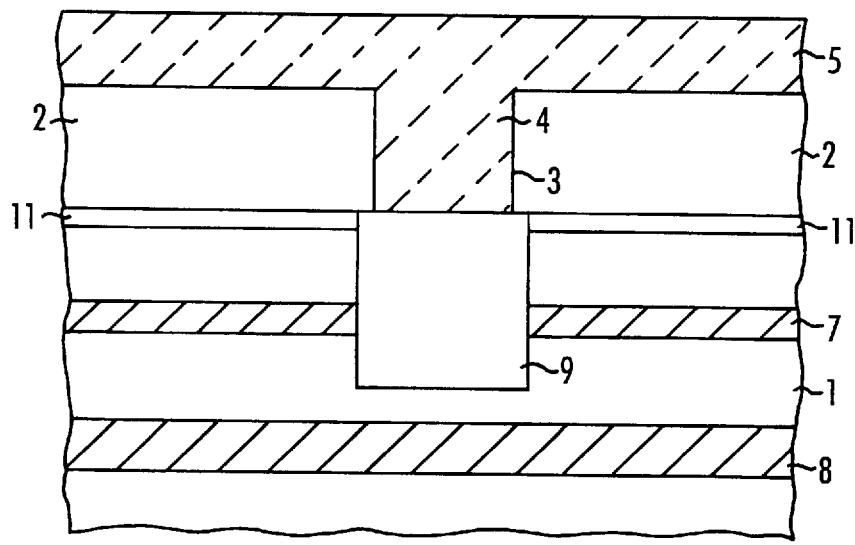
FIG. 14 illustrates a cross-sectional view of the alternative contact structure of a semiconductor device according to a fourth embodiment of the present invention.

As an alternative of the contact structure of FIG. 12, FIG. 14 illustrates a contact structure in which either one of an impurity layer 6 or an impurity layer 7 is formed. Even in such a contact structure, the bottom surface of an impurity region 9 is formed between either impurity layer 6 or 7 and an impurity layer 8, which is formed at a position deeper than the impurity layer 6 or 7. Therefore, similar to the contact structure of FIG. 1 according to the first embodiment, the contact structure which has small junction capacitance and improved junction breakdown voltage can be obtained.

The Fifth Embodiment

A description will be made of the contact structure according to the fifth embodiment using a cross-sectional view shown in FIG. 15. The contact structure shown in FIG. 15 has, in addition to the contact structure according to the first embodiment, an impurity layer 12, of the first conductivity type, formed between the surface of a semiconductor substrate 1 and the depth where the impurity layer 6 is formed. The formation of this impurity layer 12 increases the number of the regions between the maximum point of the impurity concentration of the first conductivity type and the minimum point which is located below the maximum point and is nearest thereto. Accordingly, the junction position of the bottom surface of the impurity region 9 with the semiconductor substrate 1 can be set more easily in the region between the maximum point of the impurity concentration of the first conductivity type and the minimum point which exists below the maximum point and is nearest thereto.

Figure 15:
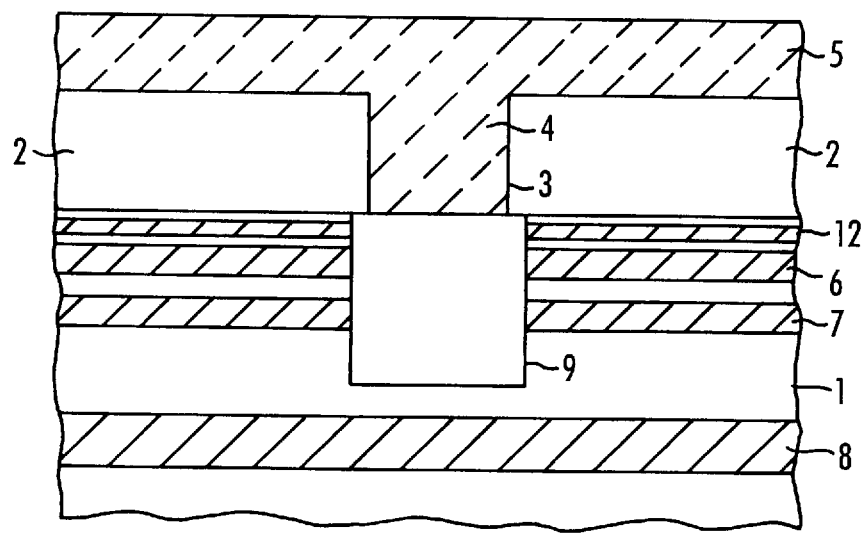
FIG. 15 illustrates a cross-sectional view of the contact structure of a semiconductor device according to a fifth embodiment of the present invention.

When a switching transistor or the like is formed using the contact structure shown in FIG. 15, the control of a threshold voltage is performed by forming plural channel regions, that is, impurity layers 12 and 6. This construction makes it possible to reduce an amount of impurities. The contact structure according to the fifth embodiment is therefore effective for the improvement of the characteristics, such as breakdown voltage, of the switching transistor in comparison with the structure in which a channel is formed of one impurity layer obtained by a single ion implantation.

The Sixth Embodiment

Figure 16:
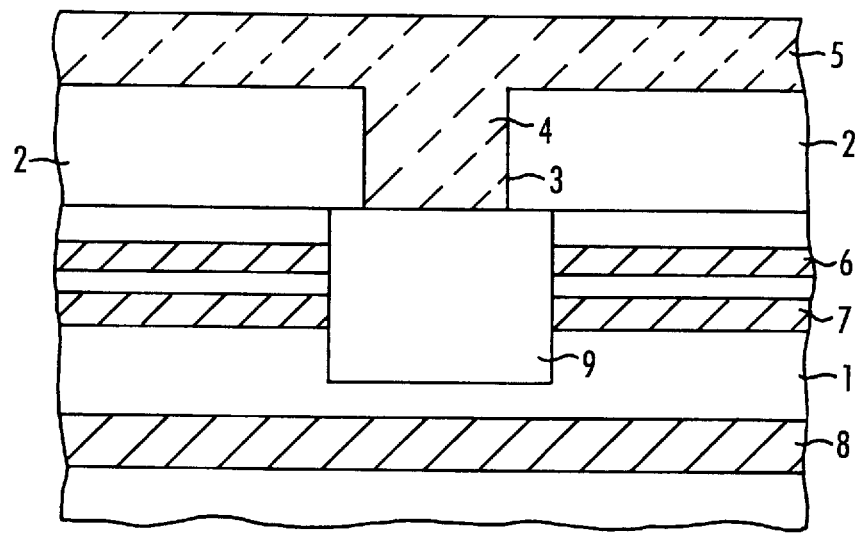
FIG. 16 illustrates a cross-sectional view of the contact structure of a semiconductor device according to a sixth embodiment of the present invention.

A description of a contact structure according to another embodiment with reference to the cross-sectional view is shown in FIG. 16. According to the contact structure shown in FIG. 16, the impurity region is larger in a horizontal direction than the impurity region 9 as described above according to the first embodiment. Such extension of the impurity region 9 in a horizontal direction makes it possible to enlarge an extension of a depletion layer, which extends from a junction between impurity layers 6, 7 and impurity region 9, when a voltage is applied to a contact conductor 4. It is therefore possible to further increase breakdown voltage of the contact.

Figure 17:
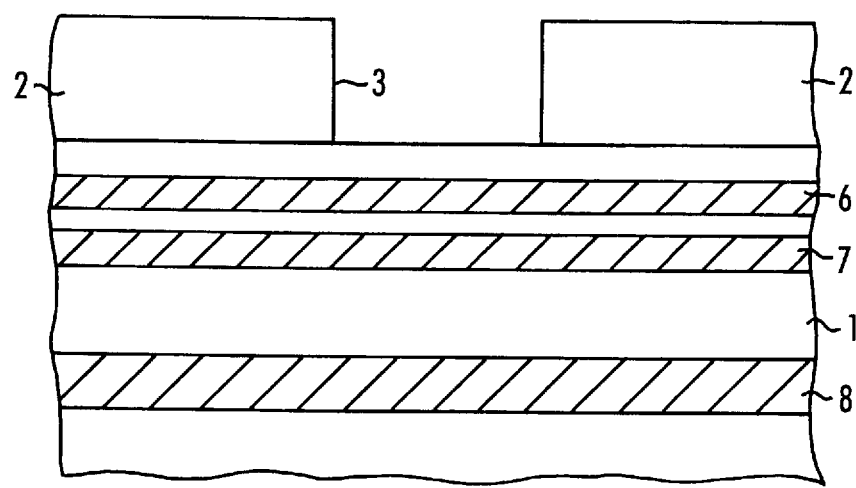
FIGS. 17–19 illustrate a manufacturing process of a semiconductor device having the contact structure according to the sixth embodiment.

A description of the manufacturing process of the contact structure is shown in FIG. 16. As illustrated in FIG. 17, in a similar manner to the first embodiment, the impurity layers 6, 7 and 8 of the first conductivity type are formed in the semiconductor substrate 1, followed by the deposition of an interlayer insulation film 2. A contact hole 3 having an opening area larger than that of the first embodiment is then formed in the interlayer insulation film 2.

Figure 18:
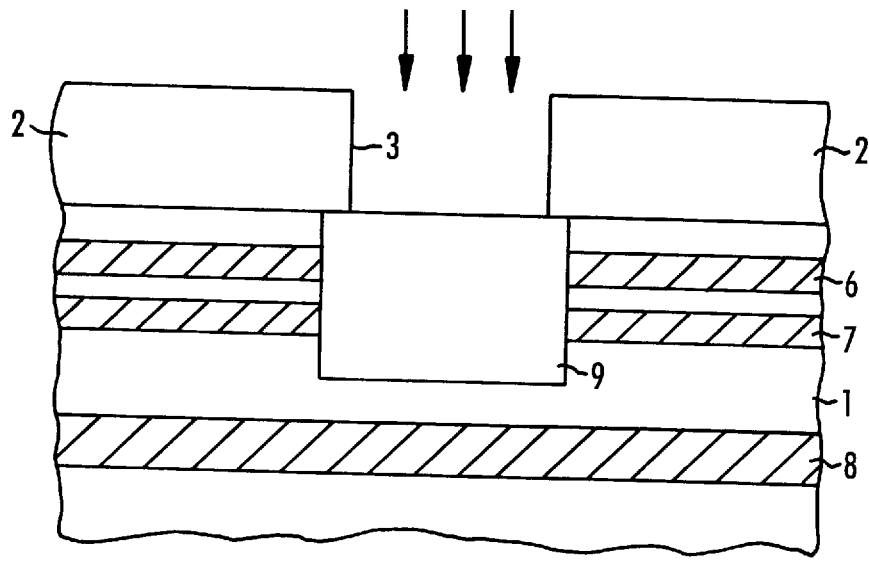

Impurities such as phosphorus or arsenic are then implanted as shown in FIG. 18, whereby an impurity region 9 wider in a horizontal direction than that shown in the first embodiment is formed, followed by the treatment to obtain an impurity profile similar to that shown in FIG. 9. At this time, the size of the impurity region 9 in a horizontal direction is about 1.4 μm which is larger than that of the impurity region 9 shown in the first embodiment.

Figure 19:
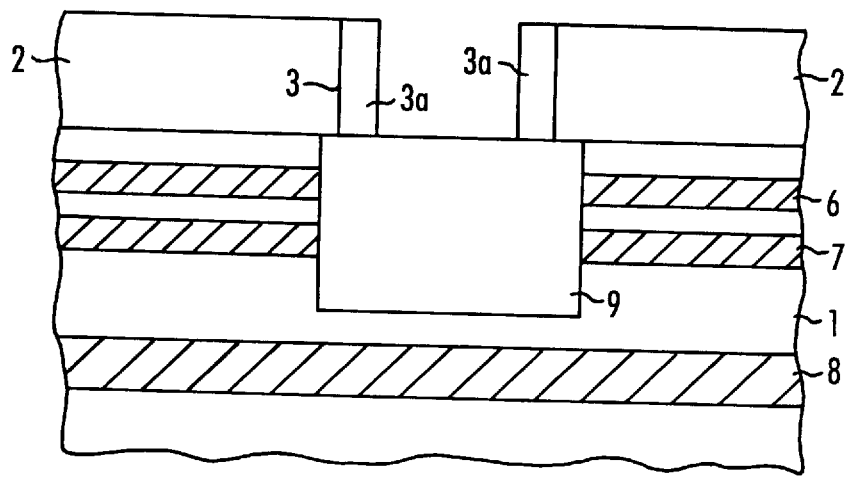

As shown in FIG. 19, an insulation film such as silicon oxide film is then formed in the contact hole 3 and on the interlayer insulation film 2 by a CVD technique. Anisotropic etching is thereafter conducted to remove the insulation film except that on the inside wall of the contact hole 3, whereby side wall 3a is formed. The formation of this side wall 3a decreases the effective opening diameter of the contact hole 3, whereby its opening diameter can be made equal to that of the contact hole 3 shown in the first embodiment, that is, 1.0 μm. In other words, the opening diameter (that is equal to the size of the contact conductor 4 in a horizontal direction) of the contact hole is 1.0 μm, the size of the impurity region 9 in the horizontal direction is 1.4 μm, that is 1.4 times as large as the opening diameter of the contact hole 3.

A connecting lead layer comprised of aluminum or the like is disposed in the contact hole 3 having side wall 3a on the inside wall, and on the interlayer insulation film 2. A connecting lead layer 5 is formed by patterning.

As described above, the contact hole 3 is first formed larger than the effective opening diameter of the contact hole, followed by decreasing the opening diameter by layer in the side wall 3a in the contact hole 3 after the ion plantation into the impurity region 9. Thus, the size of the impurity region 9 in a horizontal direction is made more than 1.2 times as large as that of the contact conductor 4 in a horizontal direction, whereby the junction area of the impurity region 9 with the semiconductor substrate 1 and the impurity layers 6 and 7 can be widened. Thus, a contact structure having high breakdown voltage can be manufactured.

Further, in the contact structure as described in the second and third embodiments, where the number of the impurity layers are varied or where the impurity region 9 is formed at a varied depth from the surface of the semiconductor substrate 1, the impurity region 9 may be widened in a horizontal direction in the same way as this sixth embodiment. The size of the impurity region 9 in a horizontal direction can be made larger than that (1.2 $\mu$m) of the impurity region obtained only by vertical ion implantation into the substrate 1 through the contact hole 3 having an opening diameter of 1.0 $\mu$m, and the breakdown voltage of the contact can be increased.

A description will be made of another manufacturing process to obtain a contact structure similar to that of FIG. 16, in which an impurity region 9 formed below a contact conductor 4 has a wide area in a horizontal direction. First, a semiconductor substrate 1 is processed similarly to the manufacturing steps shown in the drawings from FIGS. 2 through 7 in the first embodiment, whereby impurity layers 6, 7 and 8 are formed in the semiconductor substrate 1, and an interlayer insulation film 2 having a contact hole 3 are formed thereon. The opening diameter of the contact hole 3 formed here is 1.0 $\mu$m. It is formed in the same manner that the contact hole was formed in the first embodiment.

Figure 20:
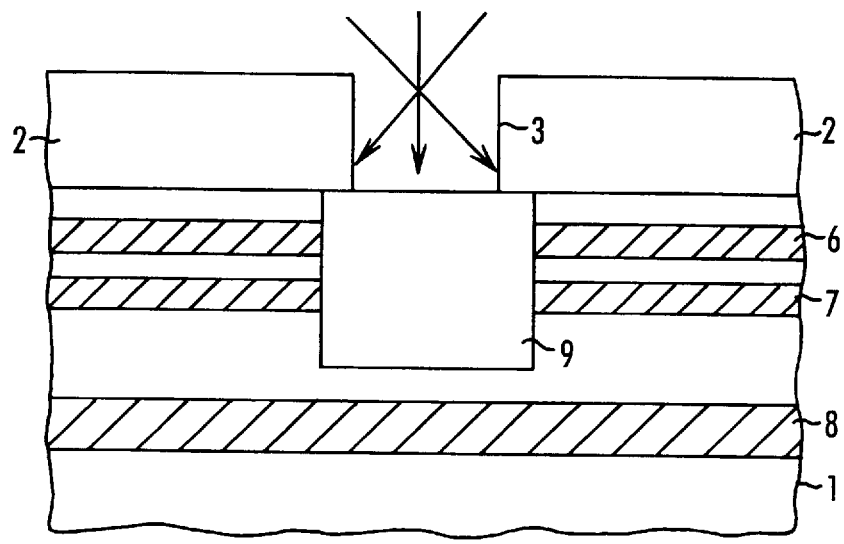
FIG. 20 illustrates another manufacturing process of a semiconductor device having the contact structure according to the sixth embodiment.

In this process, impurity ions are implanted vertically and obliquely to a main surface of the semiconductor substrate 1 through the contact hole 3 as shown in FIG. 20. Then, an impurity region 9 having a size at least 0.2 $\mu$m larger in the horizontal direction than that obtained by the vertical implantation of impurities into the main surface of the semiconductor substrate 1.

The oblique implantation of impurity ions in this manner also makes it possible to manufacture a contact structure having similar effects to the contact structure shown in FIG. 16.

As an example, the size of the impurity region 9 in a horizontal direction is 0.2 $\mu$m wider than that of the impurity region 9 of the contact structure in a semiconductor device obtained according to the first embodiment. Needless to say, an increase in the size of the impurity region by more than 0.2 $\mu$m in the horizontal direction brings about a further improvement in the breakdown voltage of the contact.

The Seventh Embodiment

A description will be made of another embodiment. There is a difference between the contact structure according to an embodiment shown in FIG. 21 and the contact structures according to the first through sixth embodiments. According to the first through sixth embodiments, an impurity concentration is uniform within the same vertical plane in each impurity layer 6, 7 and 8 respectively. In this seventh embodiment on the other hand, an impurity layer 13 with lower concentration is formed at the same depth with the impurity layer 6, and an impurity layer 14 with lower concentration is formed at the same depth with the impurity layer 7 respectively. Except for these low-concentration impurity layers 13 and. 14, the contact structure according to the seventh embodiment is similar to any one of the first to sixth embodiments. The same reference numerals represent the same portion or corresponding portion.

Figure 21:
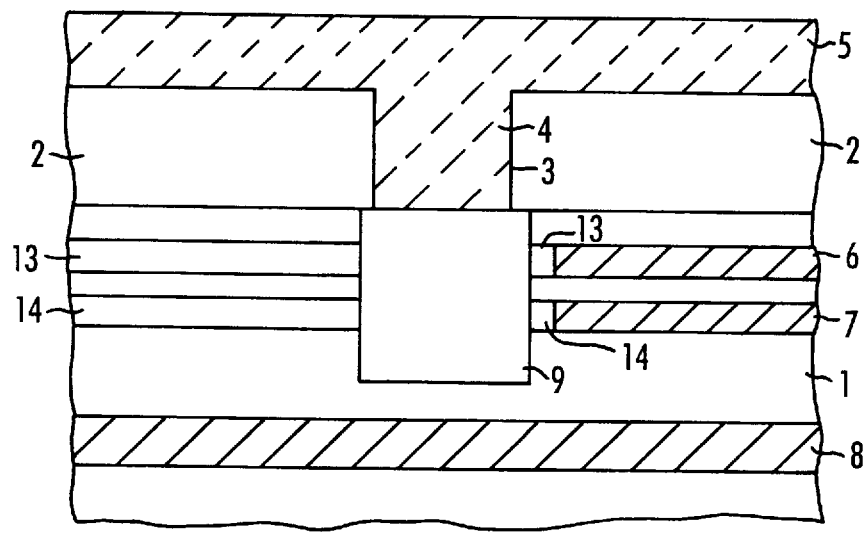
FIG. 21 shows a cross-sectional view of the contact structure of a semiconductor device according to a seventh embodiment of the present invention.
Figure 22:
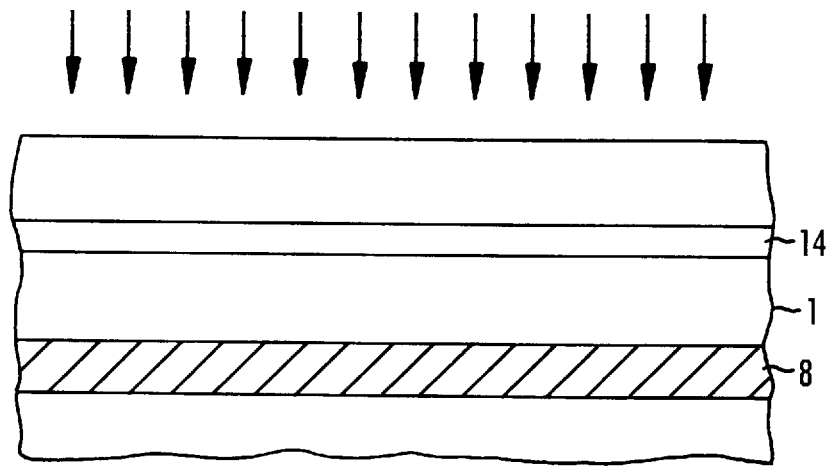
FIGS. 22–26 illustrate a manufacturing process of a semiconductor device having the contact structure according to the seventh embodiment.

A manufacturing process of the contact structure is shown in FIG. 21 and will be described. As is illustrated in FIG. 22, impurity ions of a first conductivity type are implanted into a semiconductor substrate 1 of the first conductivity type as in the other embodiment described above, whereby an impurity layer 8 similar to that of the first embodiment is formed. Impurity ions of the first conductivity type are further implanted into a region nearer to the surface of the substrate 1 than the impurity layer 8, whereby an impurity layer 14 having an impurity concentration lower than that of the impurity layer 7 of the first embodiment is formed.

Figure 23:
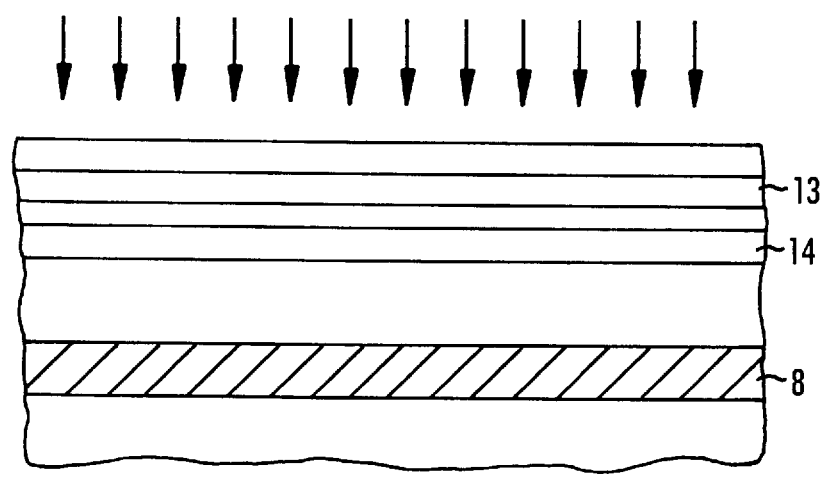

As shown in FIG. 23, ion implantation is then conducted in a similar manner employed with the formation of the low-concentration impurity layer 14, but at the impurity implantation energy smaller than that for the formation of the low-concentration impurity layer 14. Thus, a low-concentration impurity layer 13 is formed at a region nearer to the surface of the semiconductor substrate 1 than the low-concentration impurity layer 14.

Figure 24:
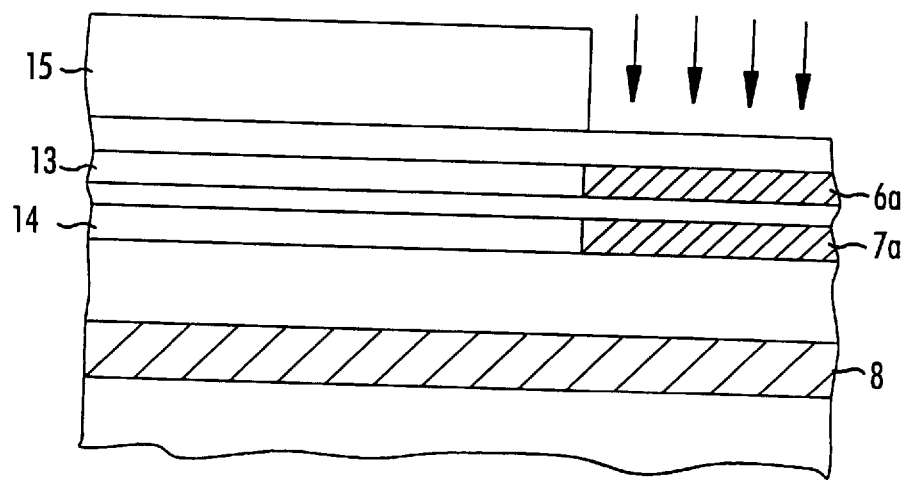

On one side of an area where a contact conductor 4 is to be formed, an impurity layer 7a, which has the same impurity concentration with that of the impurity layer 7 of the first embodiment, is formed at a depth of the low-concentration impurity region 14 as illustrated in FIG. 24. In the region where the impurity layer 7a is to be formed, the low-concentration impurity layer 4 has already been formed. Therefore, the impurity concentration of the impurity layer 7a is increased by additional implantation of the impurities of the first conductivity type, such as boron, through a resist mask 15. An impurity layer 6a, which has the same impurity concentration with that of the impurity layer 6 of the first embodiment, is formed by additional implantation of boron into the region of the low concentration impurity layer 13 located above the impurity layer 7a. The resist mask 15 is then removed.

Figure 25:
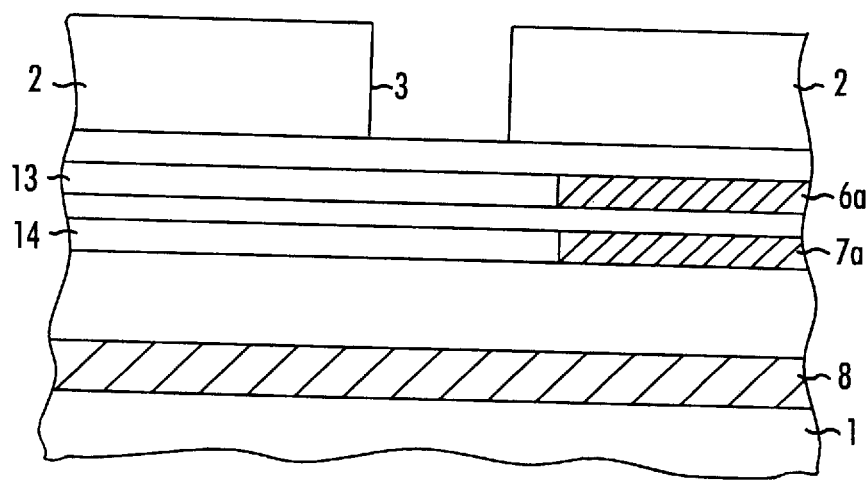
Figure 26:
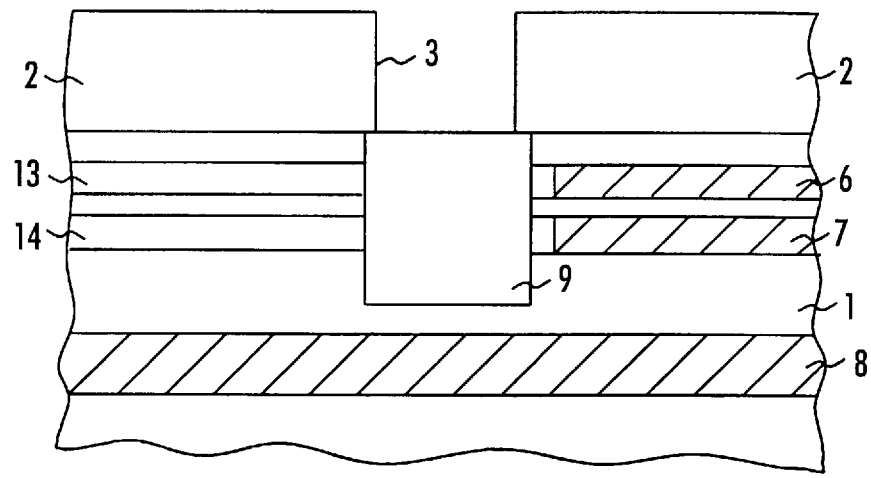

As illustrated in FIG. 25, an interlayer insulation film 2 composed of an insulation material, such as a silicon oxide film, is formed to a predetermined thickness all over the semiconductor substrate 1. On the interlayer insulation film 2, a resist pattern is disposed with an opening for forming a contact hole above the region of the low concentration impurity layers 6a and 7a. Using this resist pattern as a mask, anisotropic etching of the interlayer insulation film 2 is conducted, whereby the contact hole 3 is formed. Then, as shown in FIG. 26, after the removal of the resist pattern, an impurity region 9 is formed in a similar manner with the formation of the impurity region 9 in the first embodiment by implanting impurities such as phosphorus or arsenic. A connecting lead layer composed of a conductive material such as aluminum is buried in the contact hole 3 and is formed selectively on the interlayer insulation film 2, whereby a contact structure shown in FIG. 21 can be manufactured.

The low-concentration impurity layers 13, 14 are formed in the region facing the junction surface of the impurity region 9 and in the vicinity of the impurity region 9.

Consequently, when a voltage is applied to the contact conductor 4, a depletion layer extends from the impurity region 9 to the side of the low-concentration impurity layer 13 or 14. Therefore, the capacitance of the junction is reduced.

The Eighth Embodiment

Figure 27:
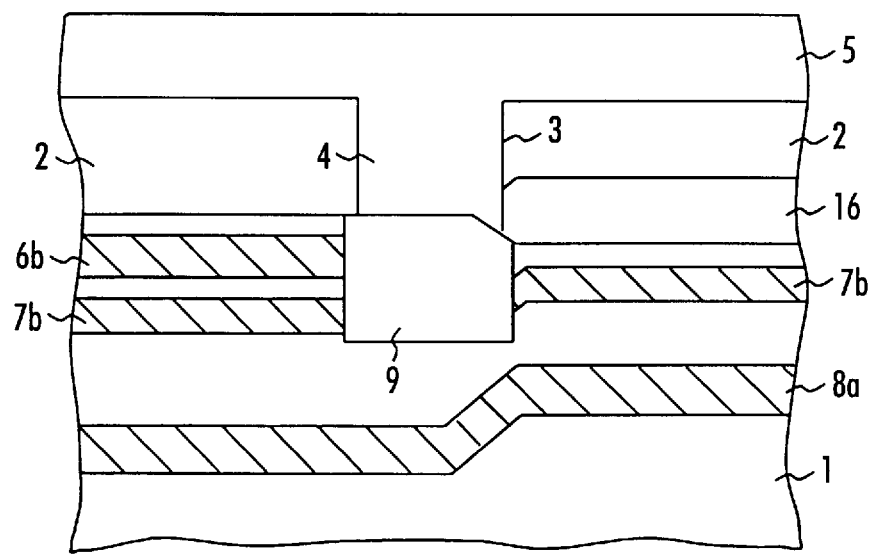
FIG. 27 shows a cross-sectional view of the contact structure of a semiconductor device according to an eighth embodiment of the present invention.

A description of the eighth embodiment follows. In the cross-sectional view of the contact structure shown in FIG. 27, a LOCOS isolation film 16 is formed on the surface of the semiconductor substrate 1 for electrically separating adjacent elements. Reference numerals which were previously used for the above description represents the same or corresponding portions. The contact structure shown in FIG. 27 is different from the contact structures shown in the first through seventh embodiments in the following point. After the formation of the LOCOS isolation film 16, an end portion thereof is subjected to etching, followed by the processing in such a way that the cross-section of the etched LOCOS isolation film 16 faces to the contact conductor 4. When more than one impurity layers are formed contacting an impurity region 9 under the contact conductor 4, impurities are implanted into the LOCOS separation film 16 so that the number of the impurity layers formed in the region under the LOCOS isolation film 16 is decreased rather than in the region where the LOCOS isolation film has not been formed.

Figure 28:
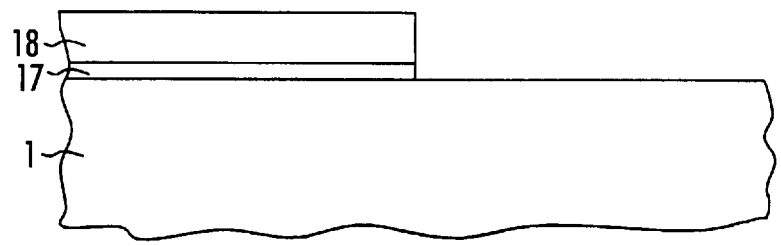
FIGS. 28–33 illustrate a manufacturing process of a semiconductor device having the contact structure according to the eighth embodiment of the present invention.
Figure 29:
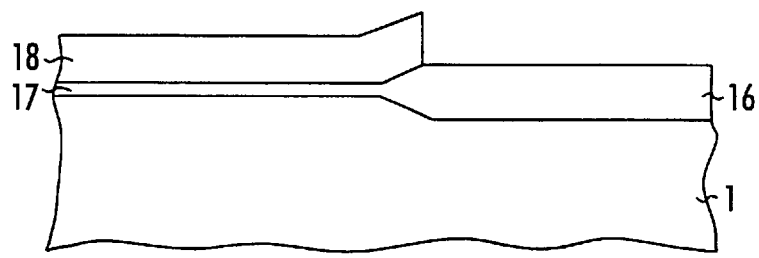

A manufacturing process of the contact structure shown in FIG. 27 follows. As shown in FIG. 28, all over the surface of the semiconductor substrate 1, an oxide film 17 and a nitride film 18 are deposited successively. The nitride film 18 and the oxide film 17 are then selectively removed by etching so that the surface of the semiconductor substrate 1 is partially exposed. As shown in FIG. 29, the exposed surface of the semiconductor substrate 1 is oxidized by thermal oxidation, whereby a LOCOS isolation film 16 composed of a silicon oxide film is obtained.

Figure 30:
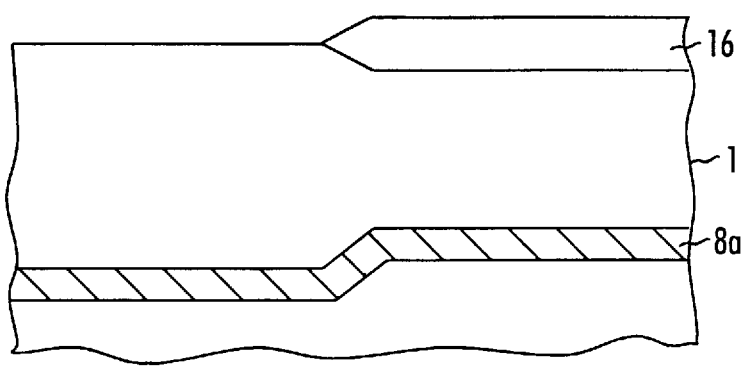

Next, as shown i FIG. 30, the nitride film 18 and the oxide film 17 are removed. Thereafter, ion implantation of impurities of the first conductivity type contained in the semiconductor substrate 1, for example boron, is conducted under the conditions similar to those employed for the formation of the impurity layer 8 in the first embodiment. As the surface of the semiconductor substrate 1 rises owing to the formation of the LOCOS isolation film 16 and therefore has a stepped portion, the impurity layer 8a is formed to have an impurity concentration profile which has maximum points with stepped difference in the semiconductor substrate 1.

Figure 31:
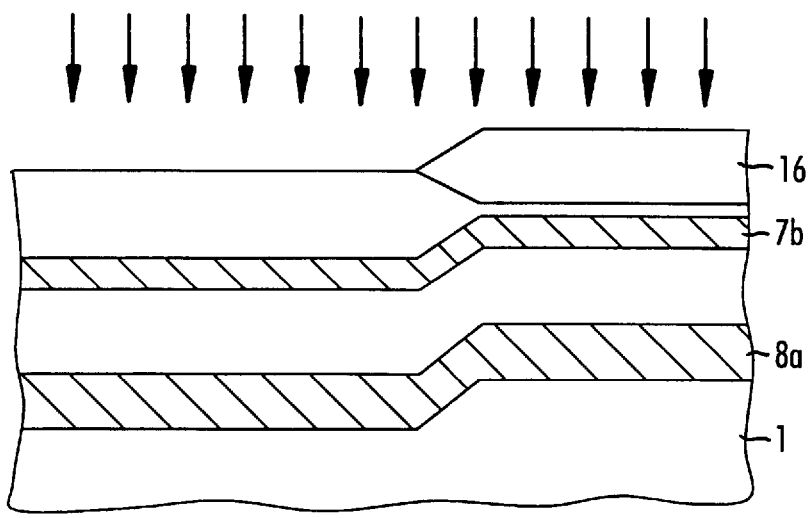
Figure 32:
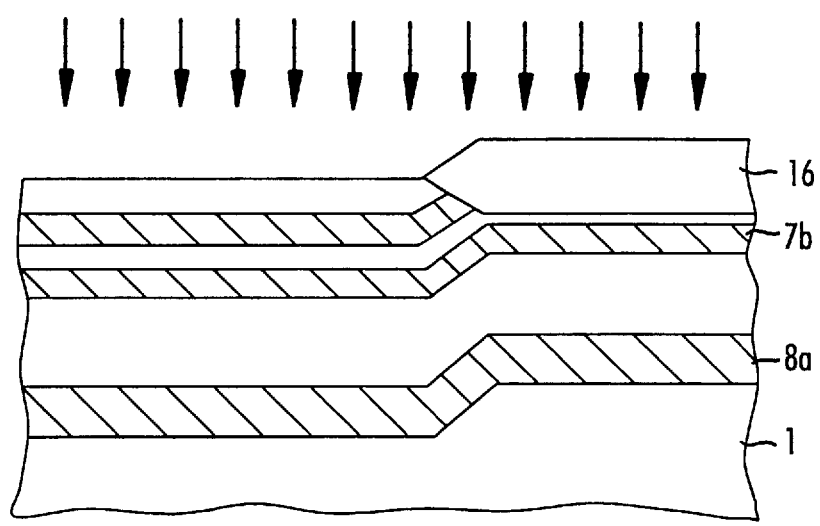

As shown in FIG. 31, boron implantation is then conducted all over the semiconductor substrate 1. An impurity layer 7b is formed in such a way that a region in the semiconductor substrate 1, where the LOCOS isolation film 16 is not formed, has an impurity concentration profile as shown in FIG. 9. The implantation energies and other conditions are then controlled, and further implantation of boron is conducted to all over the surface, whereby an impurity layer 6b is formed at the position nearer to the semiconductor surface than the impurity layer 7b as shown in FIG. 32.

Figure 33:
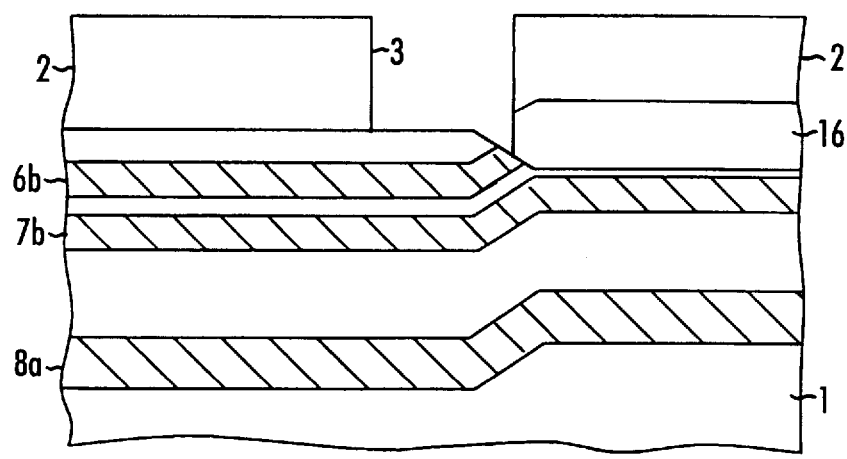

An interlayer insulation film 2 such as a silicon oxide film is formed to a predetermined thickness all over the semiconductor substrate 1. As shown in FIG. 33, a contact hole 3 is thereafter formed in such a way that an edge portion of the LOCOS isolation film 16 is removed partially by etching. Impurity ions such as phosphorus or arsenic are implanted all over the semiconductor substrate 1. By the impurities implanted from the contact hole 3, an impurity region 9 is then formed in such a way that its bottom surface is formed between the impurity layer 7b and the impurity layer 8a in the semiconductor substrate 1.

A conductive material is then buried in the contact hole 3 to form a contact conductor 4, and at the same time, the conductive material is deposited all over the interlayer insulation film 2. The conductive material is subjected to patterning, whereby a connecting lead layer 5 is formed. In this manner, the contact structure shown in FIG. 27 can be manufactured. The conductive material such as aluminum, tungsten, titanium nitride and polysilicon are used for forming the contact conductor 4 and the connecting lead layer 5.

In this case, the contact conductor 4 is formed to be in contact with the edge portion of the LOCOS isolation film 16, and the bottom surface of the impurity region 9 is formed between the impurity layers 7b and 8a facing to a range of an opposite conductivity type having a low impurity concentration. Therefore, when a voltage is applied to the contact conductor 4, a depletion layer extends widely, and breakdown voltage at the contact is improved.

As shown in FIG. 27, when a specific cross-section of the contact conductor 4 is viewed, the formation depths of the impurity layers 7b and 8a are each different between the right side and left side of the contact conductor 4, and the impurity layer 6b is formed only in the region where the LOCOS isolation film 16 has not been formed. An extension of the depletion layer extending from the boundary between the impurity region 9 and the semiconductor substrate 1 can therefore be widened in a horizontal direction. It is therefore possible to improve breakdown voltage of the contact.

The Ninth Embodiment

Figure 34:
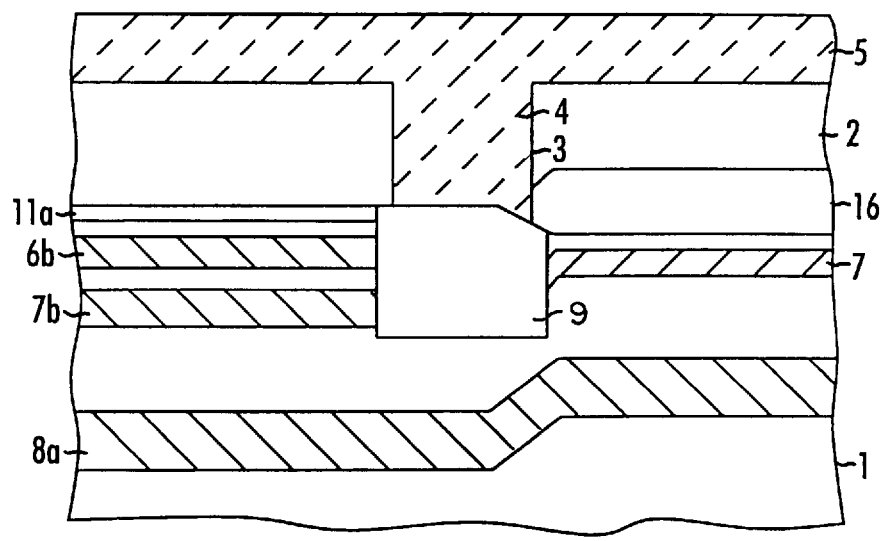
FIG. 34 shows a cross-sectional view of the contact structure of a semiconductor device according to a ninth embodiment of the present invention.

FIG. 34 illustrates the structure of a source-drain region of an MIS transistor to which the contact structure according to the eighth embodiment is applied. In this contact structure shown in FIG. 34, an impurity layer of the second conductivity type is formed on the surface of a semiconductor substrate 1 serving as an active region, and this impurity layer serves as a source-drain region 11a. In this manner, it is possible to dispose a source-drain region of a transistor by additionally forming an impurity layer.

The Tenth Embodiment

Figure 35:
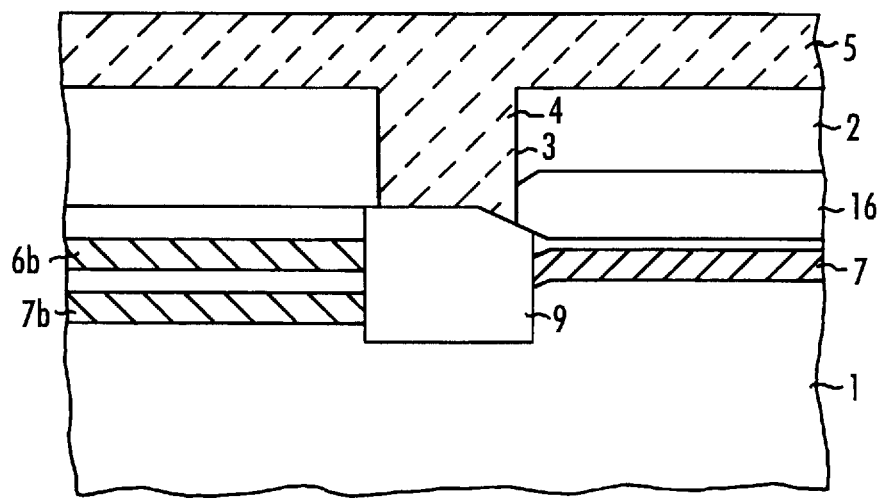
FIG. 35 shows a cross-sectional view of the contact structure of a semiconductor device according to a tenth embodiment of the present invention.

The tenth embodiment will be explained with reference to FIG. 35. The difference between the tenth embodiment and the eighth embodiment is as follows. In the contact structure of the eighth embodiment shown in FIG. 27, an impurity layer 8a is formed by implanting impurities of the first conductivity type, which are the same as those of the semiconductor substrate 1, into the semiconductor substrate 1. The contact structure of the tenth embodiment shown in FIG. 35, on the other hand, does not have the impurity layer 8a.

In such a contact structure, at a PN junction between the bottom of the impurity region 9 and the semiconductor substrate 1, a depletion layer extends widely toward the semiconductor substrate 1, when a voltage is applied to the contact conductor 4, owing to a small impurity concentration on the side of the semiconductor substrate 1 in the same manner as in the eighth embodiment. Thus, the junction breakdown voltage of the contact is improved.

The Eleventh Embodiment

The eleventh embodiment will be described with reference to FIG. 36. The difference between the eleventh embodiment and the eighth embodiment is that in the contact structure of the eighth embodiment shown in FIG. 27, the impurity region 9 formed in the semiconductor substrate 1 is formed to penetrate both of the impurity layers 6b and 7b, and the bottom surface of the impurity region 9 is formed between the impurity layer 7b and the impurity layer 8a.

Figure 36:
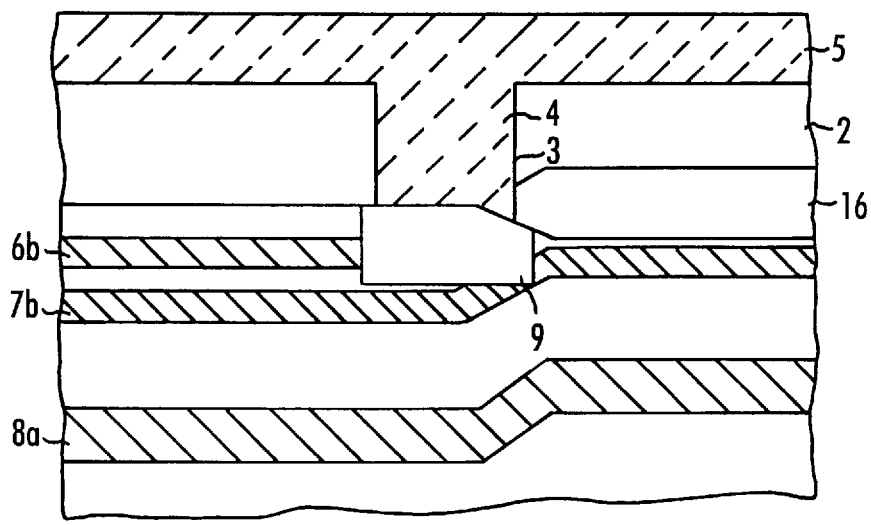
FIG. 36 shows a cross-sectional view of the contact structure of a semiconductor device according to an eleventh embodiment of the present invention.

In the contact structure according to the eleventh embodiment, the bottom surface of the impurity region 9 is formed to be disposed in a low impurity concentration region of the first conductivity type between the impurity layers 6b and 7b as shown in FIG. 36. Accordingly, a depletion layer extends from a PN junction between the semiconductor substrate 1 and the impurity. region 9 widely into the region of the low concentration when a voltage is applied to the contact conductor 4. Thus, the breakdown voltage of the contact is improved.

The Twelfth Embodiment

Figure 37:
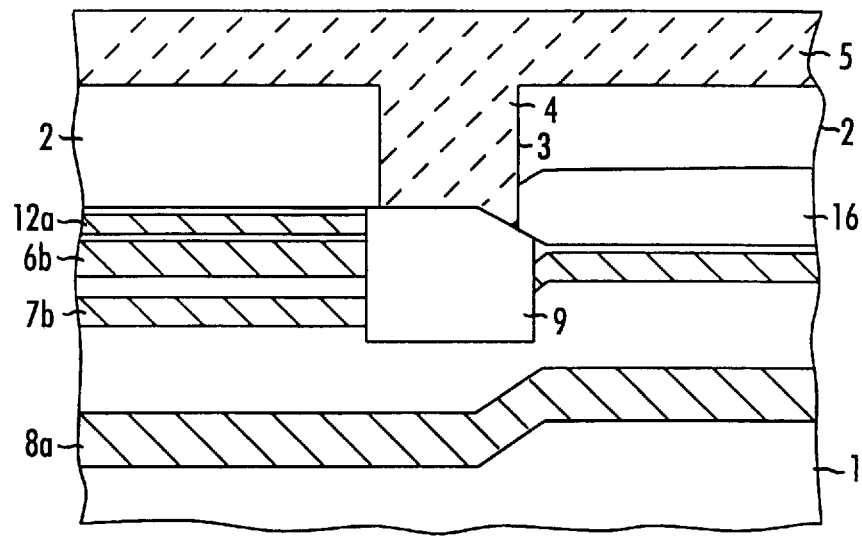
FIG. 37 shows a cross-sectional view of the contact structure of a semiconductor device according to a twelfth embodiment of the present invention.

The twelfth embodiment will be described with reference to FIG. 37. The difference between the twelfth embodiment and the eighth embodiment shown in FIG. 27 resides in that the contact structure according to the twelfth embodiment comprises, in addition to the contact structure of the eighth embodiment shown in FIG. 27, an impurity layer 12a of the first conductivity type is formed near the surface of the semiconductor substrate 1.

By the formation of this impurity layer 12a, impurity layers in an active region are increased to. three layers. In the impurity profile taken in a depth direction from the surface of the semiconductor substrate 1, the number of the minimum points of the impurities increases with a rise in the number of the peaks of the first conductivity type impurities. By positioning the bottom surface of the impurity region 9 at the minimum point of the impurities, a contact structure is obtained in which a depletion layer easily extends widely. Such a structure is effective to improve the breakdown voltage of the contact junction.

The Thirteenth Embodiment

Figure 38:
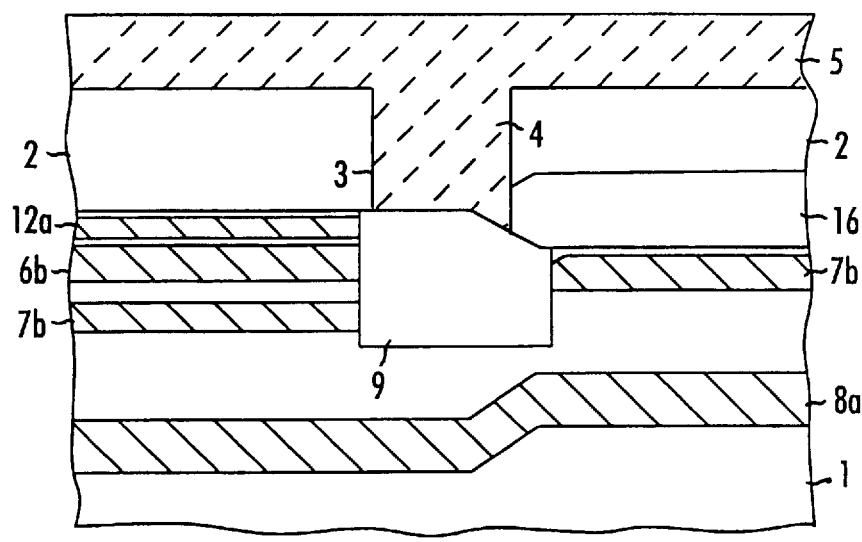
FIG. 38 shows a cross-sectional view of the contact structure of a semiconductor device according to a thirteenth embodiment of the present invention.

The thirteenth embodiment will be described with reference to FIG. 38. The difference in the contact structure between the thirteenth embodiment and the eighth embodiment shown in FIG. 27 resides in the shape of an impurity region 9 formed in the semiconductor substrate 1. According to the cross-sectional structure of the eighth embodiment, the size of the impurity region 9 in the horizontal direction is about 1.2 $\mu$m, while that of the impurity region 9 in the horizontal direction according to the thirteenth embodiment is formed as wide as about 1.4 $\mu$m.

Since the size of the impurity region 9 in the horizontal direction is as large as about 1.4 $\mu$m, the effective junction area of the impurity region 9 with the semiconductor substrate 1 and impurity layers 6b and 7b are widened. The contact structure according to the thirteenth embodiment is therefore effective to improve the breakdown voltage of the contact junction.

As an example, an embodiment of a contact structure is shown in which the impurity region 9 is wider by 0.2 $\mu$m than the impurity region 9 of the semiconductor device according to the first embodiment. Needless to say, the breakdown voltage of the contact can be improved further by increasing the size of the impurity region 9 in the horizontal direction by more than 0.2 $\mu$m than that of the impurity region 9 in the first embodiment.

The Fourteenth Embodiment

A description of the fourteenth embodiment follows. In the contact structure according to the eighth embodiment described with reference to FIG. 27 above, the edge of the LOCOS isolation film 16 is removed by etching, and the LOCOS isolation film 16 is in contact with the contact conductor 4. The impurity concentration of the impurity layers 6b, 7B and 8a formed in the semiconductor substrate 1 has a high impurity concentration respectively, and more specifically, approximately 1E17 (i.e. 1×1017) cm−3 or higher at peak point.

Figure 39:
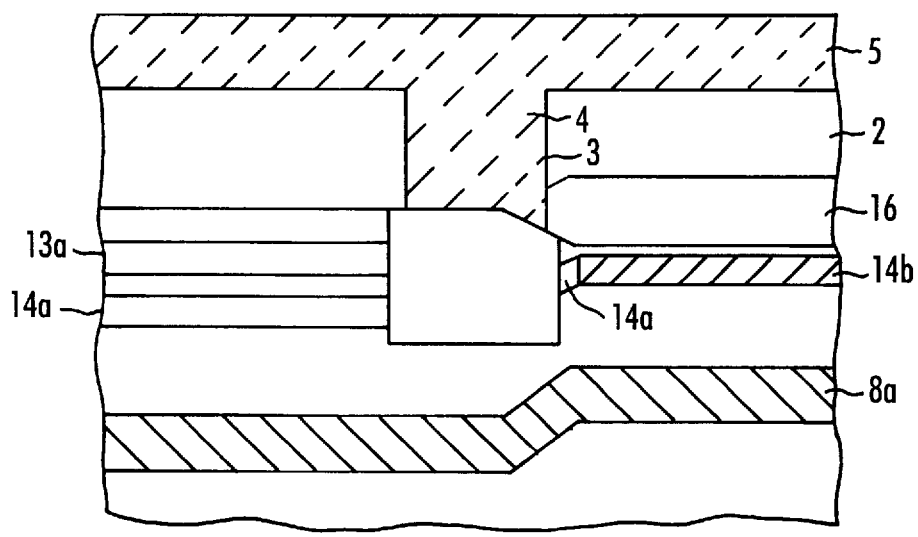
FIG. 39 shows a cross-sectional view of the contact structure of a semiconductor device according to a fourteenth embodiment of the present invention.

As shown in FIG. 39, the contact structure according to the fourteenth embodiment is characterized in that, at the boundary portion of the impurity region 9 formed in the semiconductor substrate 1 under the contact conductor 4, and at the impurity layers 13a and 14a formed below a region where no LOCOS isolation film 16 has been formed, an impurity concentration is lower than that according to the eighth embodiment.

Figure 40:
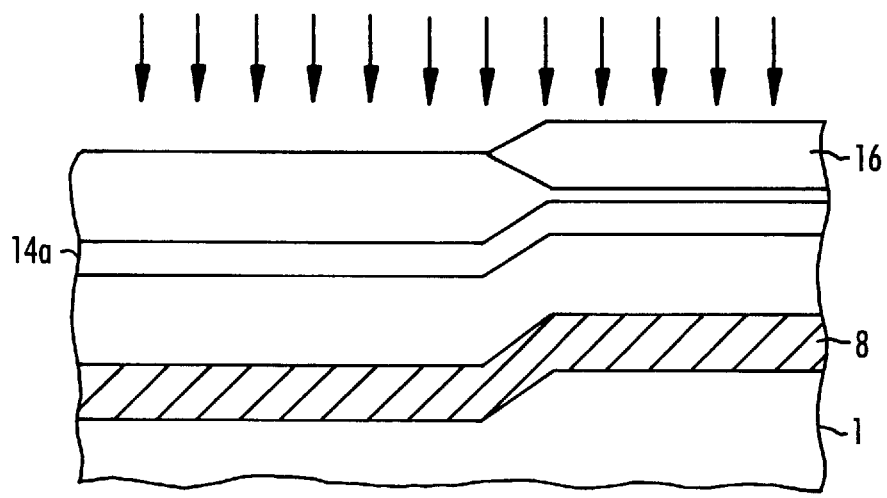
FIGS. 40–45 illustrate a manufacturing process of a semiconductor device having the contact structure according to the fourteenth embodiment.
Figure 41:
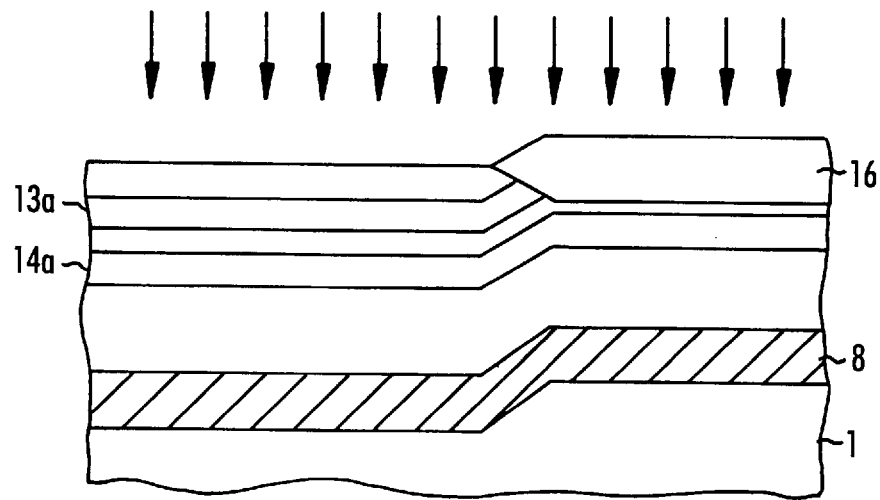

A description of the manufacturing process of the contact structure shown in FIG. 39 follows. First, according to the manufacturing process of the eighth embodiment shown in FIGS. 28 through 30, a LOCOS isolation region 16 is formed on the semiconductor substrate 1, and an impurity layer 8a of the first conductivity type is formed in a first-conductivity type P well, for example, of the semiconductor substrate 1. Thereafter, as shown in FIG. 40, impurities of the first conductivity type are implanted by ion implantation, whereby an impurity layer 14a having an impurity concentration lower than that of the impurity layer 7b of the eighth embodiment is formed. Then, as illustrated in FIG. 41, impurities are implanted at low energy, and an impurity layer 13a having an impurity concentration lower than that of the impurity layer 6b of the eighth embodiment is formed.

Figure 42:
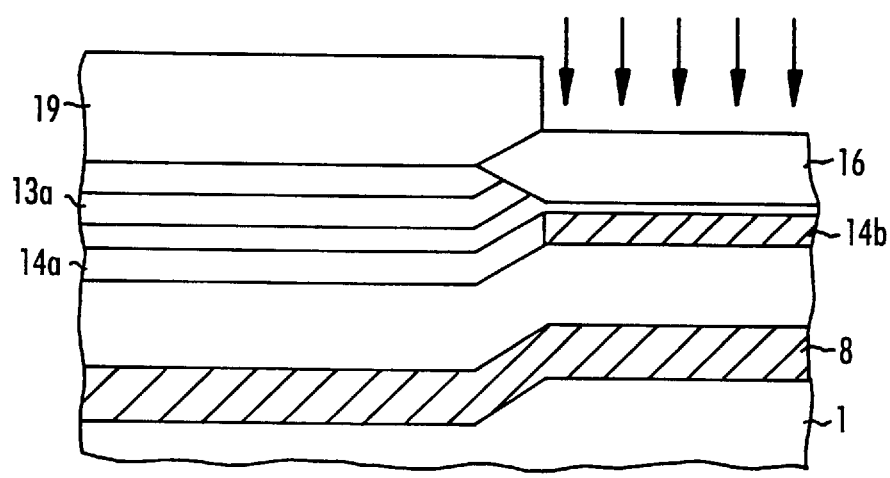

As shown in FIG. 42, a resist pattern 19 is thereafter formed on a region where the LOCOS isolation film 16 has not been formed and also on a region where the end portion of the LOCOS isolation film 16 is located having thickness not greater than a predetermined value. With the resist pattern 19 as a mask, impurities of the first conductivity type are then implanted at energies equal to those employed for the formation of the impurity layer 14a, whereby an impurity layer 14b having a concentration equal to that of the impurity layer 14 of the eighth embodiment is formed below the LOCOS isolation film 16.

Figure 43:
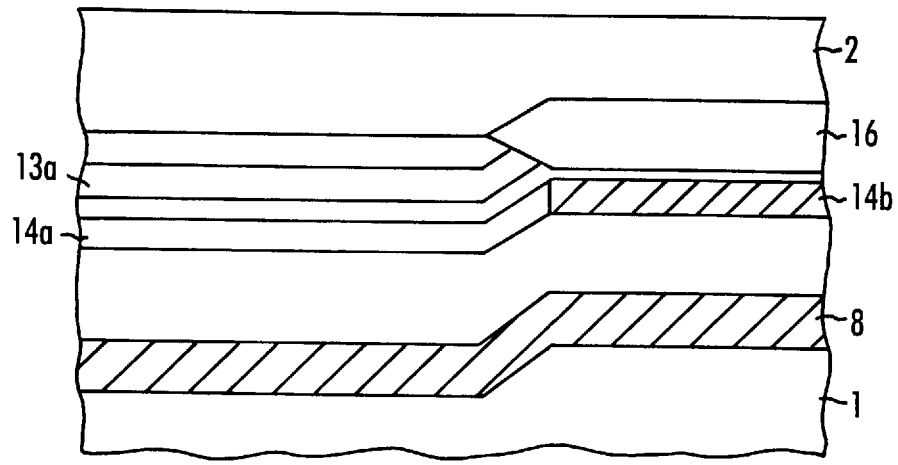
Figure 44:
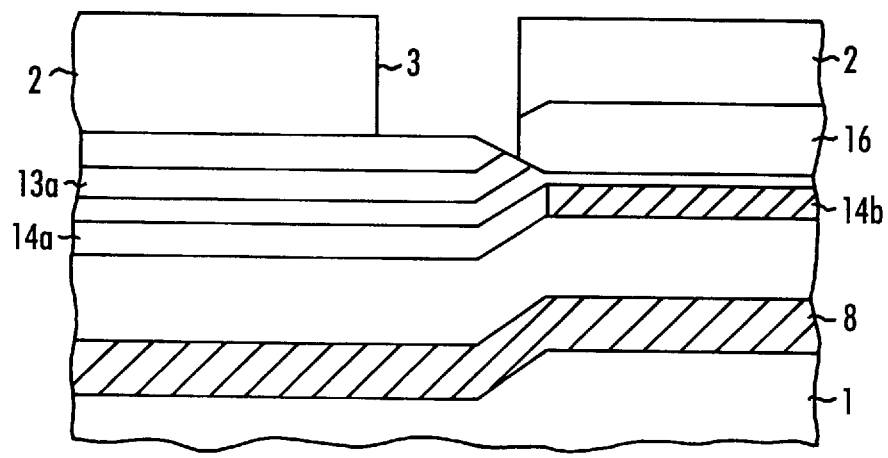

After the removal of the resist pattern 19, an insulation material such as a silicon oxide film is deposited to a predetermined thickness using a CVD technique or by sputtering or like method as illustrated in FIG. 43, whereby an interlayer insulation film 2 is obtained. Then, as illustrated in FIG. 44, a resist pattern having an opening for a contact hole is patterned on the interlayer insulation film 2 by photoengraving. With this resist pattern as an etching mask, the interlayer insulation film is subjected to anisotropic etching, whereby the edge portion of the LOCOS isolation film 16 and a part of the interlayer insulation film 2 are removed and a contact hole 3 is opened. The resist pattern 19 is then removed.

Figure 45:
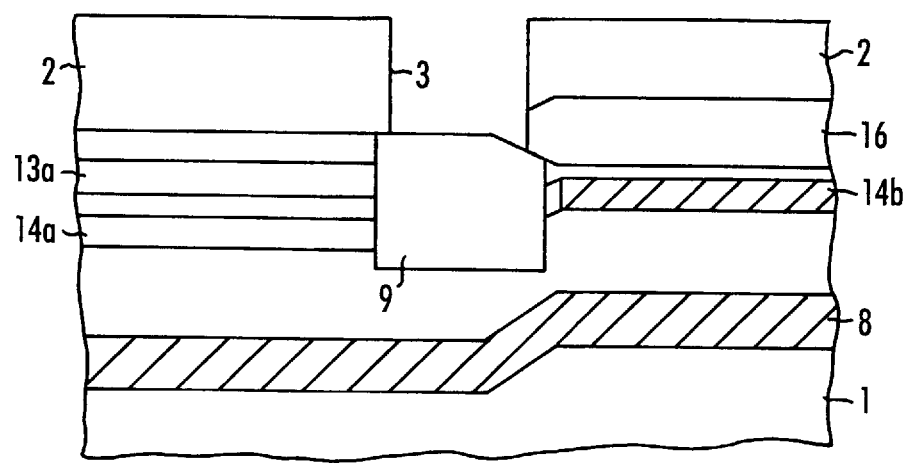

As illustrated in FIG. 45, impurities of the second conductivity type, such as phosphorus or arsenic, are implanted all over the surface of the semiconductor substrate 1 by ion implantation, whereby an impurity region 9 is formed below the contact hole 3. Similar to the contact structure described in the other embodiments above, the bottom surface of the impurity region 9 is located in a region between the impurity layer 14a and the impurity layer 8. Thus, the bottom surface of the impurity region 9 of the second conductivity type faces to a region where the impurity concentration of the semiconductor substrate 1 of the first conductivity type is low.

A conductive material such as polycrystalline silicon is then buried in the contact hole 3 by CVD technique, by sputtering or the like method to form the contact conductor 4. The conductive material is also deposited on the interlayer insulation film 2. A connecting lead layer 5 is obtained by patterning the conductive material by photograving, anisotropic etching and the like. In this manner, the contact structure shown in FIG. 39 can be manufactured.

In the contact structure as illustrated in FIG. 39, similar to the contact structures illustrated in the first through eighth embodiments, the bottom surface of the impurity region 9 is facing to the region of a low impurity concentration between the impurity layer 14a and the impurity layer 8a, whereby a depletion layer extends more easily from the junction when a voltage is applied to the contact conductor 4. Thus, the breakdown voltage of the contact is improved.

The impurity concentration of the layers 13a and 14a are made low, so that the depletion layer extends more selectively toward the impurity layers 13a and 14a, when a voltage is applied to the contact conductor 4.

The Fifteenth Embodiment

Figure 46:
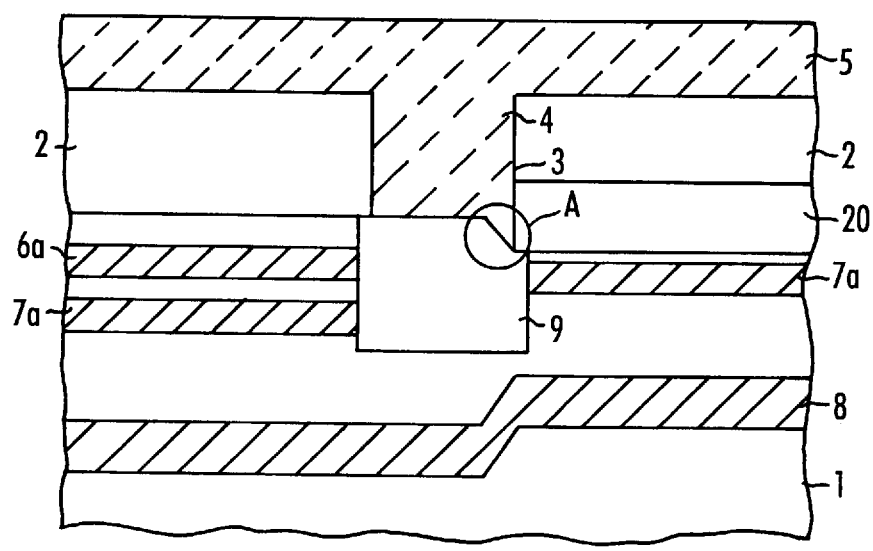
FIG. 46 shows a cross-sectional view of the contact structure of a semiconductor device according to a fifteenth embodiment of the present invention.

FIG. 46 illustrates a cross-sectional view of a contact structure according to the fifteenth embodiment. In the contact structure shown in FIG. 46, a portion of the contact conductor 4 is buried with an acute angle of 70 degree or higher from the surface plane of the semiconductor substrate 1 at a location A where the contact conductor 4 faces to an element isolation film 20 i.e. an inactive region. Accordingly, the effective area of the contact conductor 4 facing to the surface of the semiconductor substrate 1 is formed wider.

Figure 47:
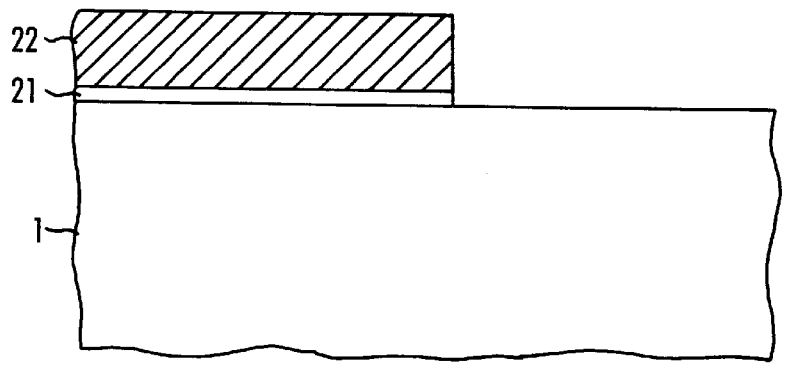
FIGS. 47–50 illustrate a manufacturing process of a semiconductor device having the contact structure according to the fifteenth embodiment of the present invention.

A manufacturing process of the contact structure shown in FIG. 46 will next be described. As shown in FIG. 47, on a semiconductor substrate 1, a silicon oxide film 21 and a silicon nitride film 22 are deposited successively to a predetermined thickness respectively. Then, the part of the silicon oxide film 21 and the silicon nitride film 22 are respectively removed selectively in the region where an element isolation film 20 is to be formed.

Figure 48:
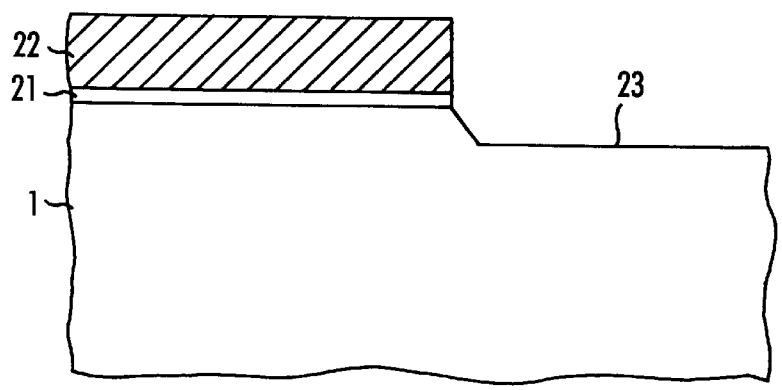

As shown in FIG. 48, a trench 23 having a predetermined thickness is formed by anisotropic etching. The side wall of the trench 23, at the end portions of the silicon oxide film 21 and the silicon nitride film 22 serving as masks, is formed by etching to have an angle of at least 70 degree from the surface plane of the semiconductor substrate 1.

Figure 49:
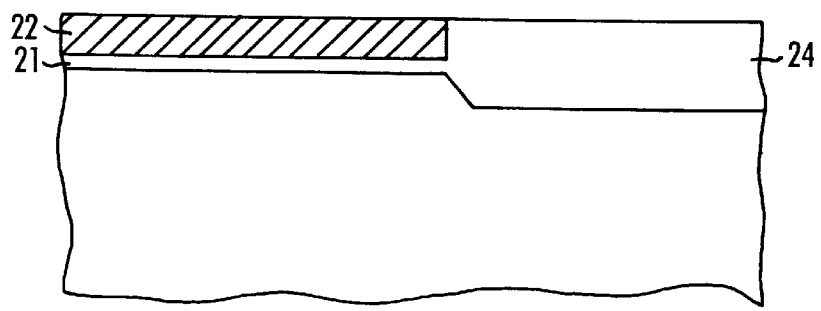

As illustrated in FIG. 49, a silicon oxide film 24, which is to be the element isolation film 20, is formed all over the semiconductor substrate 1 by a CVD technique, by sputtering or the like method. The silicon oxide film 24 is then selectively removed by abrasion or the like method, whereby the surface of the silicon nitride film 22 formed as a mask for trench etching is exposed. Abrasion is conducted until the surface of the silicon nitride film 22 and the surface of the silicon oxide film 24 reach the same level, whereby the element isolation film 20 becomes in the form buried in the trench 23.

Figure 50:
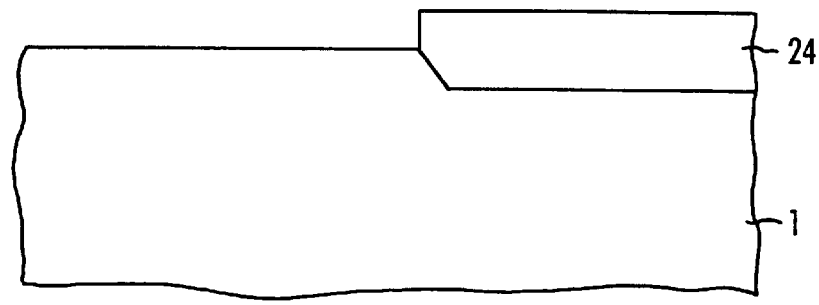

As shown in FIG. 50, the silicon nitride film 22 and the silicon oxide film 21 are selectively removed in succession. The contact structure illustrated in FIG. 46 can be manufactured by subsequent processes similar to that employed after the formation of the LOCOS isolation film 16 i the eighth or fourteenth embodiment. The contact structure having low-concentration impurity layers 13a and 14a such as in the fourteenth embodiment instead of the impurity layers 6a and 7a may be manufactured alternatively.

In the contact structure according to this embodiment, which is similar to that according to the. first through fourteenth embodiments, the bottom surface of the impurity region 9 is located between the impurity layers 6a, 7a and 8. Therefore, when a voltage is applied to the contact conductor 4, a depletion layer extends widely from the boundary portion of the impurity region 9. Thus, the breakdown voltage of the contact is effectively improved.

The boundary surface between the end portion of the element isolation film 20 and the semiconductor substrate 1 is formed to have an acute angle of at least 70 degrees relative to the surface plane of the semiconductor substrate 1. Therefore, without increasing the opening area of the contact, the effective bottom surface of the contact conductor 4 can be increased. Thus, this contact structure permits good contact resistance.

Further, in a contact structure according to the fifteenth embodiment where a portion of the bottom surface of the contact conductor 4 is inclined at an acute angle of at least 70 degrees relative to the surface of the semiconductor substrate 1, it is possible to add an impurity layer, which serves as source and drain regions, in application for an MIS transistor, or it is possible to add the impurity layers 6, 7 and/or 8 or to eliminate either one, as described in the ninth through thirteenth embodiments. Furthermore, the size of the impurity region 9 may be changed. Thus, the breakdown voltage o the contact junction can be improved.

The Sixteenth Embodiment

In the eighth through fifteenth embodiments, a description has been made of the structure where the contact conductor 4 is formed in the peripheral part of the LOCOS isolation film 16 or the element isolation film 20. A positional relationship between the contact conductor 4 and the LOCOS isolation film 16 or the element isolation film 20 will be described further in this embodiment with reference to FIGS. 51 through 55.

Figure 51:
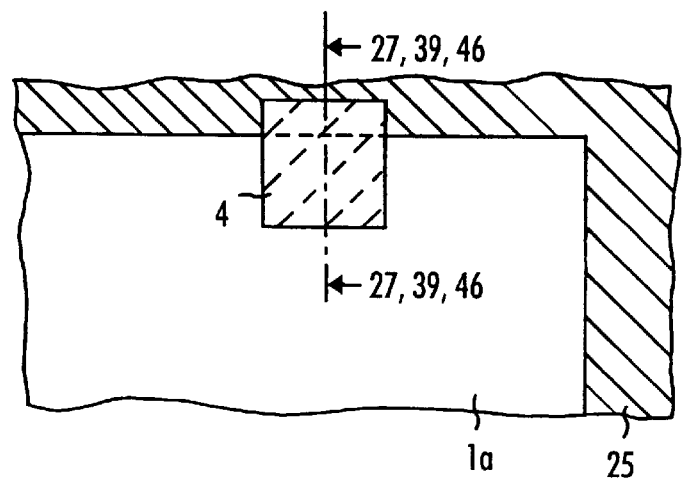
FIGS. 51–54 show plan views of the contact structure of a semiconductor device according to a sixteenth embodiment of the present invention.
Figure 52:
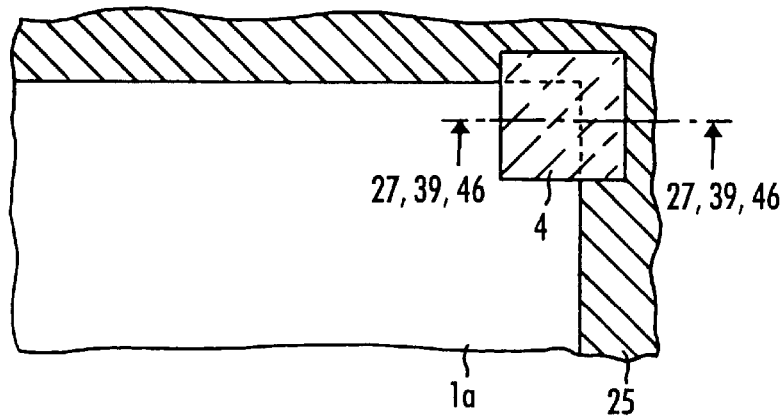
Figure 53:
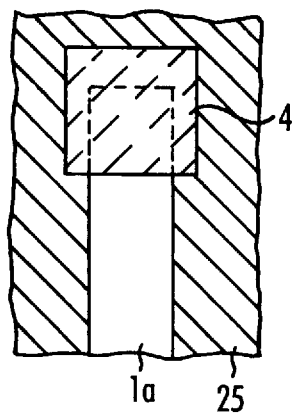

In FIGS. 51 through 53, the contact structure comprises an active region 1a on the surface of the semiconductor substrate 1 and an element isolation region 25 which includes a LOCOS isolation film 16 and an element isolation film 20. Reference numerals previously used in the above description represent the same or corresponding parts. A cross-sectional view taken along line 27, 39, 46–27, 39, 46 in FIGS. 51 or 52 corresponds to a contact structure represented by FIGS. 27, 39, 46 or the like.

In FIG. 51, a contact conductor 4 is formed on the active region 1a and the element isolation region 25, lying across a part of the boundary line thereof. In FIG. 52, the element isolation region 25 is bent, and the contact conductor 4 is formed to lie across the boundary between the element isolation region 25 and the active region 1a. In FIG. 53, the contact conductor 4 is disposed at an end portion of the linear active region 1a, lying across the three sides of the boundary between the element isolation region 25 and the active region 1a. In this manner, the contact can be formed to lie across the element isolation film 25 in various ways.

Figure 54:
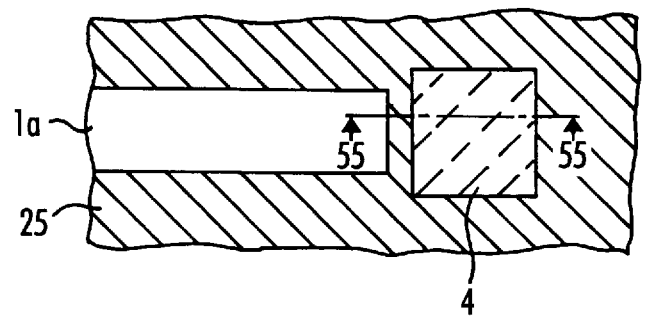

Further, in FIG. 54, the contact conductor 4 is formed by opening the contact hole 3 in the element isolation region 25, and then burying a conductive material in the contact hole 3. The active region 1a is disposed and formed in the vicinity of the contact conductor 4.

The Seventeenth Embodiment

Figure 55:
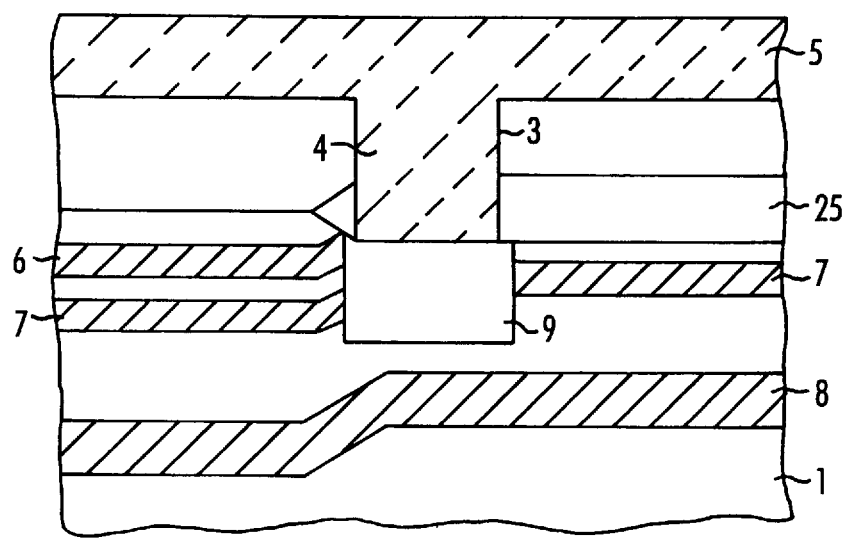
FIG. 55 shows a cross-sectional view of the contact structure of a semiconductor device according to a seventeenth embodiment of the present invention.
Figure 56:
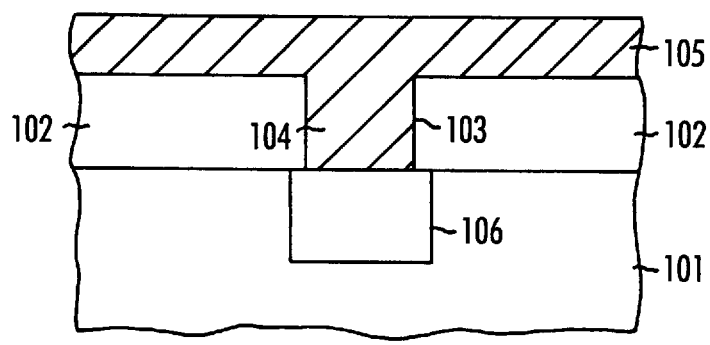
FIG. 56 is a cross-sectional view of a contact structure according to the conventional art.
Figure 57:
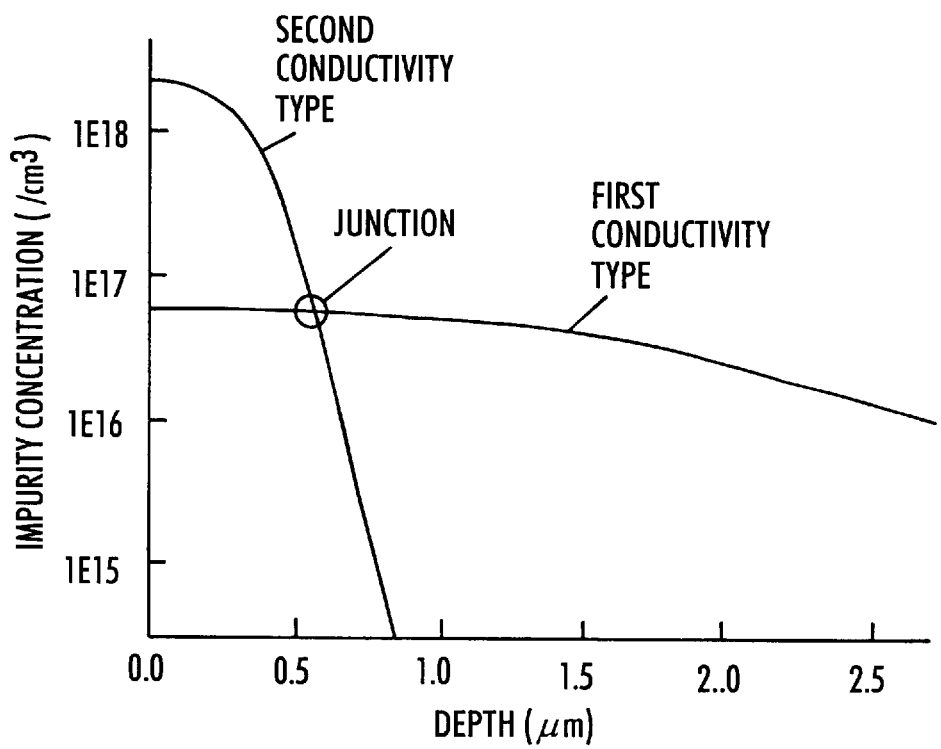
FIG. 57 illustrates an example of an impurity profile of the conventional contact structure.
Figure 58:
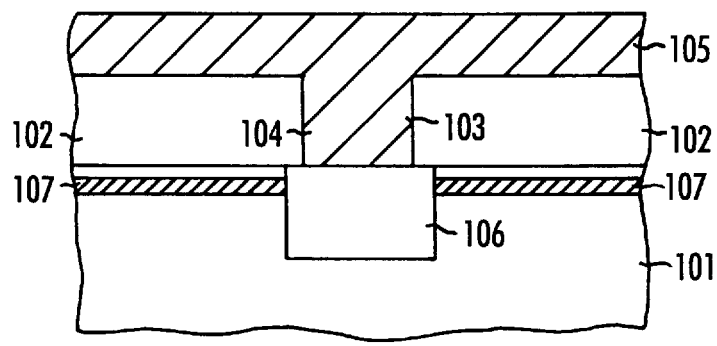
FIG. 58 is a cross-sectional view of contact structure having increased contact resistance.

FIG. 55 shows a cross-sectional view of the contact structure of a semiconductor device according to a sixteenth embodiment of the present invention. The plane view of this contact structure may be represented by FIG. 54, and FIG. 55 may be a cross-sectional view of the structure taken along the line 55—55 in FIG. 54. In FIG. 55, the reference numerals previously used for the above description represent the same or corresponding portions.

In the contact structure of FIG. 55, the element isolation film 25 is formed by the LOCOS isolation film. The manufacturing process of such a contact structure is carried on in a similar manner with other embodiments until the interlayer isolation film 2 is formed. Then, the contact hole 3 is formed by partially etching the element isolation region 25. Impurities, of the conductivity type opposite to the conductivity type of the semiconductor substrate 1, are implanted from the contact hole 3, whereby an impurity region 9 is formed in the semiconductor substrate 1. A contact conductor 4 is then formed by burying a conductive material in the contact hole 3. An interconnection 5 is formed on the interlayer insulation film 2 in contact with the contact conductor 4.

According to the contact structure as shown in FIG. 55, the contact conductor 4 is formed in the element isolation region 25, and the impurity region 9 is formed under the element isolation region 25. The impurity region 9 faces the semiconductor substrate 1 of a low concentration to form a PN junction. Therefore, when a voltage is applied to the contact conductor 4, the depletion layer increases easily, and the breakdown voltage of the contact junction is improved.

Needless to say, any manufacturing process other than those described above can be employed insofar as a contact structure as purposed is obtained.

The present invention is constructed as described above and embodied in various way, and has the advantages as follows.

In one aspect of the invention, the contact structure comprises an impurity layer and another impurity layer of a first conductivity type formed in the semiconductor substrate of the first conductivity type, and the maximum point and the minimum point of the impurity concentration of the first conductivity type are formed with an increase in the depth of the semiconductor substrate. The bottom surface of the impurity region of the second conductivity type is formed between the impurity layer and another impurity layer. In the contact structure described above, a depletion layer formed by the junction readily expands widely when a voltage is applied to the contact. Thus, a junction breakdown voltage of the contact is improved, and generation of a leakage current is restrained. Therefore, a semiconductor device which comprises a contact structure having stable characteristics is obtained.

In another aspect of the invention, the contact structure comprises one impurity layer or a plurality of impurity layers, whereby the numbers of the minimum point and the maximum point of the impurity profile and the position of each impurity layer in the substrate can be controlled. In addition, the bottom surface of the impurity region is formed between the maximum point and the adjacent minimum point located just below the maximum point. Accordingly, a depletion layer formed by the junction tends to expand easily when a voltage is applied to the contact. Therefore, the junction breakdown voltage of the contact is improved and generation of a leakage current can be suppressed. Thus, a semiconductor device which comprises a contact structure showing stable characteristics is obtained.

In another aspect of the invention, the contact structure comprises an impurity layer of the second conductivity type, having the same conductivity type with that of the impurity region, formed on the surface of the semiconductor substrate. This contact structure can be applied to an MIS transistor. Thus, in the contact structure having source and drain electrodes in an MIS transistor, the bottom surface of the impurity region is formed to face a first-conductivity type region having a low impurity concentration. Therefore, the junction breakdown voltage of the contact is improved. Thus, a semiconductor device having a contact structure with stable characteristics is obtained.

In another aspect of the present invention, the contact structure comprises a contact of which portion faces the element isolation region. Also in this contact structure, the bottom surface of the impurity region formed under the contact faces a first-conductivity type region having a low impurity concentration. Therefore, the junction breakdown voltage of the contact structure with stable characteristics is obtained.

In another aspect of the present invention, the contact structure comprises the contact conductor formed adjacent to the element isolation region, of which the bottom surface is partially buried in the semiconductor substrate in the boundary region between the contact conductor and the element isolation region. Thus, the area of the bottom surface of the contact is made larger than that in the case where the bottom surface of the contact is formed horizontally along a principal surface plane of the semiconductor substrate. Therefore, a contact resistance is effectively decreased without increasing the size of the contact. The buried portion of the contact may have an increased angle from the surface of the substrate, by which the area of the bottom surface is widened, and the contact resistance is lowered. Thus, a semiconductor device having a contact structure with stable characteristics is obtained.

In another aspect of the present invention, the contact structure has an impurity region and a continuing impurity layer. The impurity layer is composed of a first portion, of a low impurity concentration, continuing from the impurity region and extending to a certain distance, and a second portion, of a high impurity concentration, extending outside from the first portion. When a voltage is applied to the contact junction, a depletion layer extends selectively into the first portion of the impurity layer having a low impurity concentration. Therefore, the junction breakdown voltage of the contact is improved. Thus, a semiconductor device having a contact structure with stable characteristics is obtained.

In another aspect of the present invention, in the contact structure, the size of the impurity region in a horizontal direction is increased to 1.2 times as wide as the contact diameter, whereby the junction breakdown voltage of the contact can be improved. Thus, a semiconductor device having a contact structure with stable characteristics is obtained.

In another aspect of the present invention, in the contact structure, the impurity region of the second conductivity type is formed in the semiconductor substrate of the first conductivity type under the contact. The bottom surface of the impurity region is positioned at a region of the semiconductor substrate between the maximum point and the underlying adjacent minimum point of the impurity profile. In such a. structure, a depletion layer expands easily at the junction when a voltage is applied to the contact. Therefore, the junction breakdown voltage of the contact is improved, and generation of a leakage current is suppressed. Thus, a semiconductor device having a contact structure with stable characteristics is obtained.

In another aspect of the present invention, in the contact structure, which no impurity layer has been formed, an impurity layer or layers with its own impurity profile are formed in the semiconductor substrate, and another impurity layer underlying the impurity region is omitted. The bottom surface of the impurity region is disposed at the minimum point of the impurity profile. In such a contact structure, a depletion layer formed at the junction position expands easily when a voltage is applied to the contact, and the junction breakdown voltage of the contact is improved. Thus, a semiconductor device having a contact structure with stable characteristics is obtained.

Obviously, numerous additional modifications and variations of the present invention are possible in light of the above teachings. It is therefore to be understood that within the scope of the appended claims, the present invention may be practiced otherwise than as specifically described therein.

We claim:

1. A semiconductor device comprising a semiconductor substrate of a first conductivity type;
   either: a single impurity layers or more than one spaced apart impurity layers of the first conductivity type formed in said semiconductor substrate, said single impurity layer or more than one spaced apart impurity layers of the first conductivity type having higher impurity concentration than said semiconductor substrate of a first conductivity type;
   an impurity region of a second conductivity type penetrating one of said impurity layer or layers and extending to a predetermined depth from a main surface of said semiconductor substrate, said impurity region of a second conductivity type terminating in said semiconductor substrate apart from said impurity layer or layers;
   a contact conductor formed on the main surface of said semiconductor substrate in contact with said impurity region.

2. A semiconductor device according to claim 1, in which at least one of said impurity layers is positioned deeper than said impurity region and not reached by said impurity region.

3. A semiconductor device according to claim 1, wherein a plurality of said impurity layers are penetrated by said impurity region.

4. A semiconductor device according to claim 1, wherein at least one of said impurity layers has therein a first area in contact with said impurity region and a second area extending from said first area, said first area having a lower impurity concentration than that of said second area.

5. A semiconductor device according to claim 1, in which said impurity region has a bottom surface terminating between a plurality of said impurity layers or one impurity layer where the impurity concentration is lower.

6. A semiconductor device according to claim 1, wherein said impurity region is wider than said contact conductor.

7. A semiconductor device according to claim 1, further comprising an impurity layer of the second conductivity type formed in contact with said impurity region on said main surface of said semiconductor substrate.

8. A semiconductor device according to claim 1, wherein said contact conductor is formed in contact with an element isolation region formed on said main surface of said semiconductor substrate.

9. A semiconductor device according to claim 1, wherein said contact conductor has a bottom surface inclined into said semiconductor substrate from said main surface of said semiconductor substrate.

10. A semiconductor device according to claim 1, in which said single impurity layer or more than one spaced apart impurity layers of the first conductivity type are formed in said semiconductor substrate by ion implantation of a predetermined energy or by different predetermined energy respectively.

* * * * *